United States Patent
Ciubotaru et al.

(10) Patent No.: US 9,912,304 B2
(45) Date of Patent: Mar. 6, 2018

(54) TWO-INPUT AMPLIFIER

(71) Applicant: Analog Devices, Inc., Norwood, MA (US)

(72) Inventors: Alexandru A. Ciubotaru, Somerset, NJ (US); Christoph Maximilian Steinbrecher, Topsfield, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/864,676

(22) Filed: Sep. 24, 2015

(65) Prior Publication Data

US 2016/0308492 A1 Oct. 20, 2016

Related U.S. Application Data

(60) Provisional application No. 62/149,352, filed on Apr. 17, 2015.

(51) Int. Cl.
| | |
|---|---|
| *H03F 3/45* | (2006.01) |
| *H03F 3/19* | (2006.01) |
| *H03F 1/42* | (2006.01) |

(52) U.S. Cl.
CPC ............. *H03F 3/19* (2013.01); *H03F 1/42* (2013.01); *H03F 3/45475* (2013.01); *H03F 2200/451* (2013.01); *H03F 2203/45116* (2013.01); *H03F 2203/45134* (2013.01); *H03F 2203/45522* (2013.01); *H03F 2203/45526* (2013.01); *H03F 2203/45528* (2013.01)

(58) Field of Classification Search
CPC ........................................................ H03F 3/45
USPC .................................................. 330/69, 260
See application file for complete search history.

(56) References Cited

U.S. PATENT DOCUMENTS

| | | | |
|---|---|---|---|
| 4,728,905 A | | 3/1988 | Zhiwei |
| 5,508,663 A | * | 4/1996 | Konno ................. H03F 3/217 |
| | | | 330/10 |
| 6,034,568 A | | 3/2000 | Bonaccio et al. |
| 7,346,313 B2 | | 3/2008 | Cafarella |
| 7,378,881 B1 | | 5/2008 | Opris |
| 7,400,196 B2 | | 7/2008 | Wyatt |
| 7,839,212 B2 | | 11/2010 | Huang et al. |
| 8,160,237 B2 | | 6/2012 | Larzabal et al. |

(Continued)

OTHER PUBLICATIONS

"Op Amp Bandwidth and Bandwidth Flatness" Analog Devices MT-045 Tutorial (Rev.0, Oct. 2008, WK) (2009) pp. 1-6.

(Continued)

*Primary Examiner* — Henry Choe
(74) *Attorney, Agent, or Firm* — Knobbe Martens Olson & Bear LLP

(57) ABSTRACT

A two-input amplifier is disclosed. The amplifier can include an amplification path for a first input signal that can have adjustable flatness or high-frequency peaking, and an amplification path for a second input that can be substantially independent of the frequency-shaping aspect of the first-input path. The first-input amplification path can include an operational amplifier as an active device and a plurality of passive elements for frequency shaping. The second-input amplification path can include a device that injects its output current into a node of the first path. The signals of the two paths can be combined and appear substantially independently of each other at the output of the amplifier.

19 Claims, 17 Drawing Sheets

(56) References Cited

U.S. PATENT DOCUMENTS

| | | |
|---|---|---|
| 8,232,841 B1 * | 7/2012 | Aram .................. H03H 11/126 |
| | | 330/103 |
| 8,558,611 B2 | 10/2013 | Bulzacchelli et al. |
| 8,581,661 B2 | 11/2013 | Friend et al. |
| 8,970,305 B1 * | 3/2015 | Aram ...................... H03G 5/00 |
| | | 330/109 |
| 2014/0240044 A1 | 8/2014 | Narita |
| 2015/0048885 A1 | 2/2015 | Chiang et al. |
| 2015/0061764 A1 | 3/2015 | Lee et al. |

OTHER PUBLICATIONS

J. Müller, et al.; "Optical Peaking Enhancement in High-Speed Ring Modulators" Scientific Reports | 4 : 6310 | DOI: 10.1038/srep06310 (2014) pp. 1-9.

Xavier Ramus; "A Numerical Solution to an Analog Problem" Texas Instruments—Application Report SBOA124—Apr. 2010—pp. 1-10.

Kitchin, et al.; "A Designer's Guide to Instrumentation Amplifiers"( $3^{rd}$ Edition) Analog Devices, G02678-15-9/06(B) (2006) pp. 1-8.

Ritter; "Avoiding op amp motor boating" ; Planet Analog, Sep. 3, 2009 pp. 1-6.

Gano, et al.; "New Multiple Input Fully Differential Variable Gain CMOS Instrumentation Amplifier" ISCAS 2000—IEEE International Symposium on Circuits and Systems, May 28-31, 2000; pp. 449-452.

* cited by examiner

TWO-INPUT AMPLIFIER

CROSS-REFERENCE TO RELATED APPLICATION

This application claims the benefit under 35 U.S.C. § 119(e) of U.S. Provisional Application No. 62/149,352, filed Apr. 17, 2015, the entirety of which is hereby incorporated by reference.

BACKGROUND

Field

The present invention relates to the field of integrated circuits, in particular to amplifiers.

Description of the Related Art

Amplifiers are well-known building blocks used in integrated circuits for providing large signal levels required at various points in the signal-processing chain. Among the most important parameters of amplifiers are gain and bandwidth, along with other metrics related to DC performance, large-signal operation, and noise. In addition to bandwidth, another important parameter in wideband applications is bandwidth flatness, which is defined as the maximum gain variation in the frequency range of interest. In high-frequency applications, it can be relatively difficult to achieve good bandwidth flatness due to the presence of circuit and device parasitics, which affect circuit performance. Moreover, some circuit applications use an additional input for injecting a signal into the main amplification path, creating additional challenges for maintaining the original amplifier performance while providing the required performance for the path associated with the second input.

SUMMARY

The methods and devices of the described technology each have several aspects, no single one of which is solely responsible for its desirable attributes.

In one embodiment, an apparatus includes a first amplifier having at least one non-inverting input node, at least one inverting input node, and at least one output node, the at least one first non-inverting input node being configured to receive a first input signal, at least one feedback resistor disposed in a signal path between the at least one inverting input node and the at least one output node, at least one input device disposed in a signal path between the at least one inverting input node and a second input signal, and a peaking network including at least one passive storage device and at least one resistive device connected in series and between the at least one non-inverting input node and a second node, wherein the second node comprises a ground or a second inverting input node.

In another embodiment, an apparatus for amplifying includes a first amplifier having at least one non-inverting input node, at least one inverting input node, and at least one output node, the at least one first non-inverting input node being configured to receive a first input signal, at least one feedback resistor disposed in a signal path between the at least one inverting input node and the at least one output node, at least one input device disposed in a signal path between the at least one inverting input node and a second input signal, and a means for frequency shaping coupled between the at least one non-inverting input node and a second node, wherein the second node comprises a ground or a second inverting input node, wherein the frequency shaping means is configured to configured to shape a frequency response of amplification of the first input signal and not the second input signal.

In another embodiment, a method of amplifying includes receiving a first input signal at a first non-inverting input node of a first amplifier wherein the first amplifier also has at least one inverting input node and at least one output node, wherein there is at least one feedback resistor disposed in a signal path between the at least one inverting input node and the at least one output node, wherein there is at least one input device disposed in a signal path between the at least one inverting input node and a second input signal, and frequency shaping a frequency response of amplification of the first input signal and not the second input signal via a peaking network coupled between the at least one non-inverting input node and a second node, wherein the second node comprises a ground or a second inverting input node, wherein the peaking network comprises at least one passive storage device and at least one resistive device connected in series and between the at least one non-inverting input node and a second node.

BRIEF DESCRIPTION OF THE DRAWINGS

These drawings and the associated description herein are provided to illustrate specific embodiments of the invention and are not intended to be limiting.

DETAILED DESCRIPTION

Figure 1:
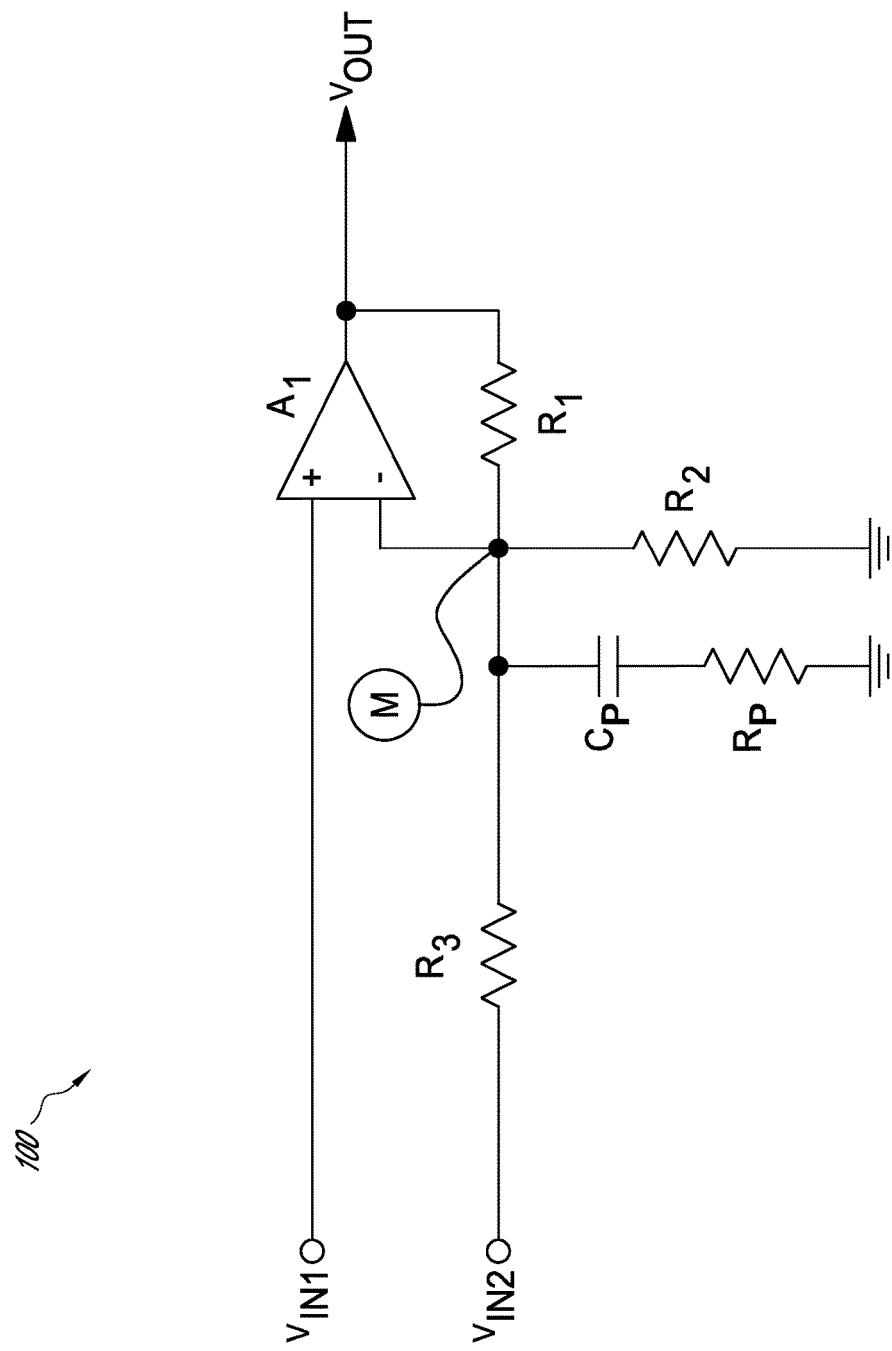
FIG. 1 is a diagram of an example single-ended two-input amplifying circuit according to one embodiment.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented substantially independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Transmit signal injection into the receive chain of a transceiver for the purposes of calibration of in-phase (I) and quadrature-phase (Q) balance can be implemented with multi-input amplifiers, which can combine the multiple signals from the receive chain and the transmit chain. Common drawbacks in the known art include relatively limited linearity and relatively poorly controlled gain and flatness due to the limitations in the performance of integrated individual stages. An integrated wideband amplifier with individual stages and signal paths can be used for wideband applications. Separating these two paths may effectively turn such a wideband amplifier into a two-input amplifier, which can be used for combining signals. However, such a two-input amplifier circuit can have the same gain, flatness, and linearity limitations as the previously discussed known art due to its individual stages.

Achieving bandwidth flatness in a modern integrated circuit amplifier can be challenging. For high-frequency amplifiers, achieving aggressive bandwidth specifications becomes difficult, and high-frequency peaking can be employed. The peaking characteristic of an additional amplifier stage can compensate for the high-frequency roll-off characteristic of the original amplifier, resulting in an overall relatively flat bandwidth in the frequency range of interest and increased overall bandwidth. To achieve bandwidth flatness, a peaking network can be employed to increase the frequency bandwidth of an amplifier. Frequency peaking can also be implemented using inductance in the feedback network of a high-gain amplifier. However, that approach can use a relatively large area for accommodating an inductor for the inductance in an integrated circuit, and offers little flexibility in adjusting the peaking characteristic.

As such, previously known approaches for realizing peaking in an integrated circuit amplifier often offer relatively little flexibility for adjusting the peaking characteristic, which can result in relatively inaccurate peaking characteristics.

As disclosed herein, in some embodiments, a single-ended circuit may accurately implement the peaking function. In some embodiments, using an instrumentation amplifier and the single-ended peaking function circuit, a differential peaking circuit can be obtained. A controllable peaking characteristic can be achieved using a differential peaking amplifier.

The described amplifiers herein may be advantageous when two high-frequency signals are combined and delivered to the output of an amplifier, with the additional possibility of using programmable peaking for enhancing bandwidth and flatness. There is currently a need in the art for such circuits, which is being addressed by the embodiments disclosed herein.

A two-input amplifier is disclosed. The amplifier can include a first input amplification path for the first input that can have adjustable flatness or high-frequency peaking, and a second input amplification path for the second input that can operate substantially independently of the frequency-shaping aspect of the first-input path. In certain embodiments, the second input amplification path has no frequency shaping or high-frequency peaking. The first input amplification path can include an operational amplifier as an active device and a plurality of passive elements for frequency shaping. The second input amplification path can include a device that injects its output current into a node of the first input amplification path. The signals of the two paths can be combined and appear substantially independently of each other at the output of the amplifier. One advantage of the disclosed implementation is that, unlike conventional circuits, adjustable frequency response shaping can be achieved for the transfer function for one input without affecting the transfer characteristics for the other input. The circuit is suitable for use in such circuits as high-frequency transceivers, where signals from calibration circuitry are injected into the amplification chains for the main signals.

A high-frequency two-input amplifier is disclosed. The transfer characteristics associated with the first input has adjustable bandwidth flatness which can be implemented using a combination of switches and capacitors connected to a relatively high open-loop gain amplifier core with negative feedback. The amplifier core can be a voltage-mode amplifier accepting a voltage input and producing a voltage output, or a transimpedance amplifier accepting a current input and producing a voltage output (also known as a current-feedback amplifier). From the received second input, a second output signal component approximating a current, which can be injected into the first path of the amplifier at an appropriate location, can be generated so that the first output signal component does not disturb the second output signal component. The second output signal component appears at the amplifier output substantially independently of the first output signal component. In addition, the first output signal component does not disturb the second output signal component. The first output signal component can appear at the amplifier output substantially independent of the second output signal component. A linear function of both of the first input signal and the second input signal appears at the amplifier output. Both single-ended and differential configurations can be implemented and are disclosed. The disclosed circuit can be used in systems that require the precise summation of two high-frequency signals, while achieving bandwidth flatness correction for at least one of the signals. As illustrated in FIGS. 1-17, same or similar notations or numerals of circuit elements denote corresponding circuit elements whose respective functions and characteristics are similar or analogous in various implementations of the current disclosure.

FIG. 1 is a diagram illustrating an example single-ended two-input amplifier in accordance with one embodiment. The illustrated amplifying circuit 100 includes an amplifier $A_1$ having inverting and noninverting inputs and an output. The circuit 100 also includes passive elements: resistors $R_1$, $R_2$, $R_3$, and $R_P$ and a capacitor $C_P$ for frequency shaping and current injection. The resistors $R_1$, $R_2$, $R_3$, and $R_P$ and the capacitor $C_P$ have corresponding resistances $R_1$, $R_2$, $R_3$, and $R_P$ and capacitance $C_P$ as referenced in the equations that follow. The capacitor $C_P$ corresponds to an explicitly added storage device and not to mere parasitic capacitance. However, parasitic capacitance can be taken into account when sizing the capacitor $C_P$. In the single-ended embodiment illustrated in FIG. 1, an end of the series combination of the resistor $R_P$ and the capacitor $C_P$ and an end of the resistor $R_2$ are shown connected to a reference voltage, such as ground. In differential embodiments, rather than being connected to ground, the equivalent components to the resistor $R_P$ and the capacitor $C_P$ can be connected to a different feedback node or to a common-mode voltage as will be discussed later in connection with the differential embodiments. In the illustrated embodiment, the resistors $R_2$ and $R_P$ and the capacitor $C_P$ form a peaking network or a frequency shaping means. The two voltage inputs of the circuit 100 are two voltage signals: a first input $v_{in1}$ and a second input $v_{in2}$. The output of the circuit 100 is a voltage signal, an output $v_{out}$. The circuit 100 can achieve fixed high-frequency peaking for the first input $v_{in1}$, and injection of the second input $v_{in2}$ via the resistor $R_3$. In some embodiments, the amplifier $A_1$ can be implemented with a voltage amplifier whose open-loop gain is $\alpha(s)$, and the passive elements can be implemented such that $R_3 \gg R_2$. In such embodiments, the transfer function $H_1$ associated with the first input $v_{in1}$ can be obtained from FIG. 1 by setting $v_{in2}=0$ and using the circuit analysis below:

$$H_1(s) = \frac{V_{OUT}(s)}{V_{IN1}(s)} = \frac{a(s)}{1 + a(s) \cdot \beta(s)} \quad (1)$$

where $$\beta(s) = \frac{z_2(s)}{R_1 + z_2(s)} \quad (2)$$

$$z_2(s) = \frac{R_2 \left( R_P + \frac{1}{sC_P} \right)}{R_2 + R_P + \frac{1}{sC_P}} \quad (3)$$

and s, ω, and f are the complex frequency, angular frequency, and signal frequency, respectively ($s = j\omega = j2\pi f$).

In embodiments with $R_1$, $R_2 \gg R_P$, as is generally the case, Equation (2) relating to the feedback gain $\beta(s)$ can be simplified to:

$$\beta(s) \cong \frac{R_2(1 + sC_P R_P)}{R_1 + R_2 + sC_P R_1 R_2} \quad (4)$$

If $\alpha(s)$ is sufficiently large such that $\alpha(s) \cdot \beta(s) \gg 1$, Equation (1) can be simplified to:

$$H_1(s) = \frac{V_{OUT}(s)}{V_{IN1}(s)} \cong \frac{1}{\beta(s)} \cong \left( 1 + \frac{R_1}{R_2} \right) \frac{1 + sC_P \frac{R_1 R_2}{R_1 + R_2}}{1 + sC_P R_P} \quad (5)$$

Following a similar approach, the transfer function $H_2$ associated with the second input $v_{in2}$ can be obtained from FIG. 1 by setting $v_{in1}=0$:

$$H_2(s) = \frac{V_{OUT}(s)}{V_{IN2}(s)} = -\frac{R_1}{R_3} \cdot \frac{a(s) \cdot \beta(s)}{1 + a(s) \cdot \beta(s)} \quad (6)$$

where the feedback gain $\beta(s)$ can be approximated by Equation (4).

For open loop gain $\alpha(s)$ sufficiently large such that $\alpha(s) \cdot \beta(s) \gg 1$, Equation (6) can be simplified to:

$$H_2(s) = \frac{V_{OUT}(s)}{V_{IN2}(s)} \cong -\frac{R_1}{R_3} \quad (7)$$

FIG. 1 also shows a node M, which is an inverting input node or can be considered as a feedback node of the amplifier $A_1$. Equations (5) and (7) can be obtained using operational amplifier analysis methods by noticing that for large $\alpha(s) \cdot \beta(s)$, the voltage at the node M follows the voltage of the noninverting amplifier input $v_{in1}$. The transfer function $H_1(s)$ has the mathematical form of a peaking characteristic dependent on $R_1$, $R_2$, and $C_P$, which define the zero of the transfer function at the angular frequency $$\frac{R_1 + R_2}{R_1 R_2 C_P}.$$

In the illustrated embodiment, the transfer function $H_2(s)$ is a simple scaling function (inverting amplifier) for the second input, dependent on the ratio of $R_1$ and $R_3$, as the node M is at virtual ground with respect to the second input $v_{in2}$.

Figure 2:
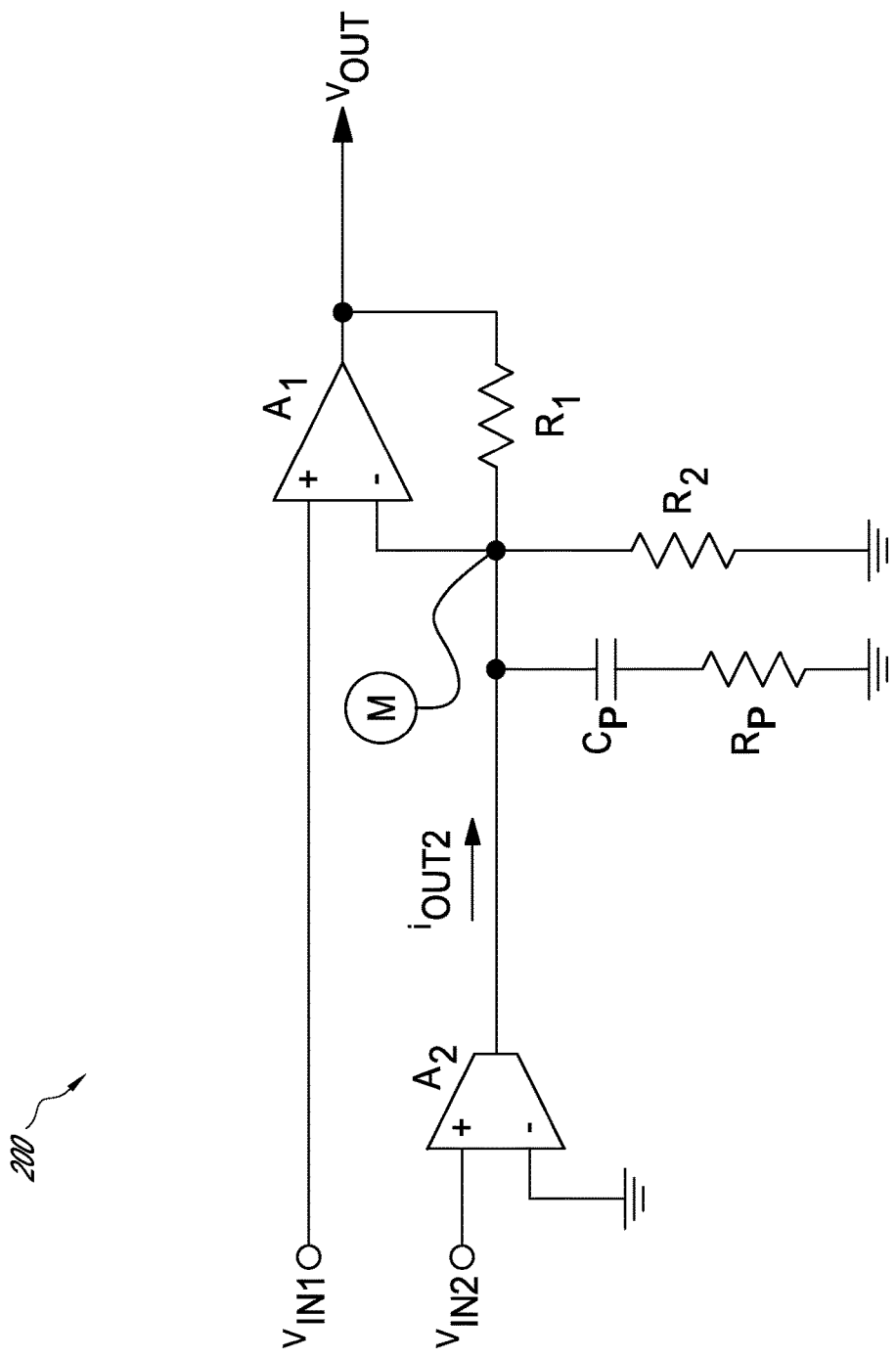
FIG. 2 is a diagram of an example single-ended two-input amplifying circuit according to another embodiment.

FIG. 2 is a diagram illustrating an example single-ended two-input amplifier in accordance with another embodiment. The illustrated amplifying circuit 200 includes, among others, a transconductance amplifier $A_2$ receiving the second input $v_{in2}$ and outputting $i_{out2}$. The circuit 200 can achieve fixed high-frequency peaking for the first input $v_{in1}$ and injection of the second input $v_{in2}$ via the transconductance amplifier $A_2$. In the circuit 200 of FIG. 2, the transconductance amplifier $A_2$ is used in lieu of the resistor $R_3$ in FIG. 1. This configuration can be useful in cases where the magnitude of the transfer function $|H_2|$ assumes larger values than achievable by the $$\frac{R_1}{R_3}$$

ratio discussed above in connection with FIG. 1. In some embodiments in which the output impedance of the transconductance amplifier $A_2$ is relatively large and can be ignored, the transfer function $H_1$ associated with the first input $v_{in1}$ can be obtained as described by Equation (5) discussed above. The transfer function $H_2$ associated with the second input $v_{in2}$ can be obtained as:

$$H_2(s) = \frac{V_{OUT}(s)}{V_{IN2}(s)} = -G_A R_1 \cdot \frac{a(s) \cdot \beta(s)}{1 + a(s) \cdot \beta(s)} \quad (8)$$

where $G_A$ is the transconductance of the amplifier $A_2$ in FIG. 2.

For $\alpha(s)$ sufficiently large such that $\alpha(s) \cdot \beta(s) \gg 1$, Equation (8) can be simplified to:

$$H_2 = \frac{V_{OUT}(s)}{V_{IN2}(s)} \cong -G_A R_1 \quad (9)$$

which indicates a simple proportionality between $v_{out}$ and $v_{in2}$. Unlike Equation (7) for the circuit 100 in FIG. 1, however, the proportionality factor can be substantially larger because the transconductance $G_A$ can generally be made much larger than the conductance $1/R_3$ using an active transconductor for the transconductance amplifier $A_2$.

For the inputs $v_{in1}$ and $v_{in2}$ having their Laplace transforms $V_{IN1}(s)$ and $V_{IN2}(s)$ respectively, using the transfer functions $H_1(s)$ and $H_2(s)$ derived above and applying superposition, the Laplace transform of the output voltage $v_{out}$ in FIG. 1 or 2 is obtained as:

$$V_{OUT}(s) = H_1(s) \cdot V_{IN1}(s) + H_2(s) \cdot V_{IN2}(s) \quad (10)$$

In some embodiments, the amplifier $A_1$ of the circuits 100 and 200 in FIGS. 1 and 2 can be implemented with a voltage-mode amplifier or a current-feedback (transimpedance) amplifier. In such embodiments, the simplified transfer functions of Equations (5), (7), and (9) discussed above can be applicable. In some embodiments, the first input $v_{in1}$, which is being peaked according to the disclosure herein can have a frequency ranging from about 100 MHz to 8400 MHz, while the second input $v_{in2}$, which is being amplified substantially independent from the peaking of the first input $v_{in1}$, can have a frequency of around 2 GHz. Other frequencies will also be applicable and will be readily determined by one of ordinary skill in the art.

Figure 3:
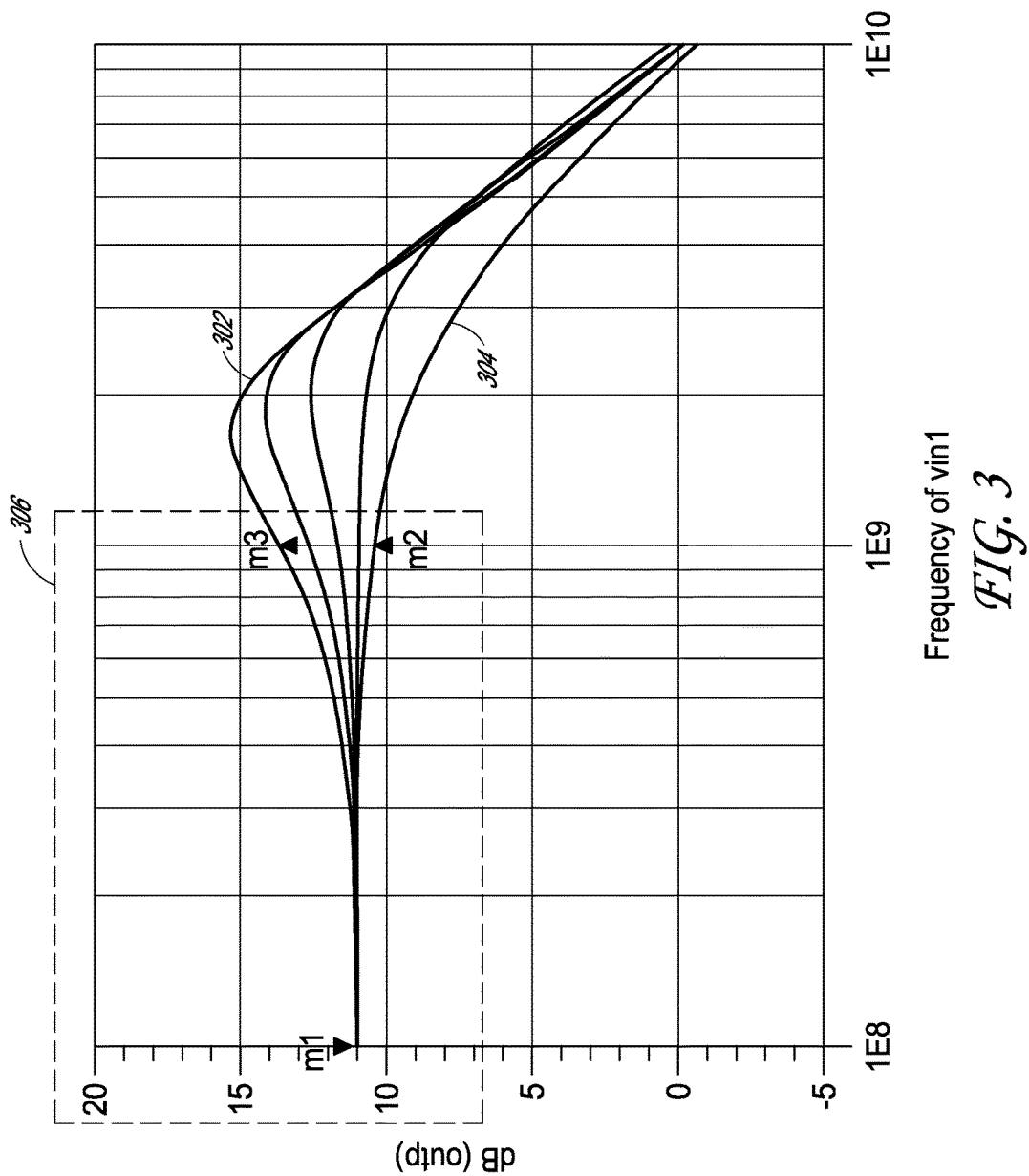
FIG. 3 is an illustration of an example transfer function associated amplifying circuit the example amplifying circuits of FIGS. 1 and 2.

FIG. 3 illustrates various transfer functions associated with the first input $v_{in1}$ of the circuits 100 and 200 in FIGS. 1 and 2, for different values of capacitance $C_P$. FIG. 3 shows an exemplary representation of the magnitude of the transfer function $H_1(s)$ 1, which is associated with the first input $v_{in1}$, for the circuits 100 and 200 of FIGS. 1 and 2, as a function of frequency for different amounts of peaking capacitance $C_P$. The exemplary illustration in FIG. 3 shows graphs 302 and 304 and a region of interest 306. Larger peaking can be observed for larger peaking capacitance $C_P$, in accordance with Equation (5), and in the illustrated example in FIG. 3, and the maximum peaking and the minimum peaking are shown in the graphs 302 and 304 respectively. In some embodiments, the peaking shown in the graph 302 can be implemented with, for example, an amount of peaking capacitance $C_P$ of 2 pF, while the graph 304 represents an exemplary natural response of the amplifier without any intentional peaking capacitance ($C_P=0$). The region of interest 306 for compensating high-frequency roll-off is in the vicinity of the transfer function zero provided by the peaking capacitance $C_P$ (e.g., input frequency corresponding to in $$\frac{R_1 + R_2}{R_1 R_2 C_P}$$

in Equation (5) above). For input frequencies above this region of interest 306, for the simplified transfer function of Equation (5), the response can be determined by the zero at angular frequency $$\frac{R_1 + R_2}{R_1 R_2 C_P},$$

by the pole at angular frequency $$\frac{1}{R_P C_P},$$

and by the intrinsic behavior of $\alpha(s)$ itself.

Figure 4:
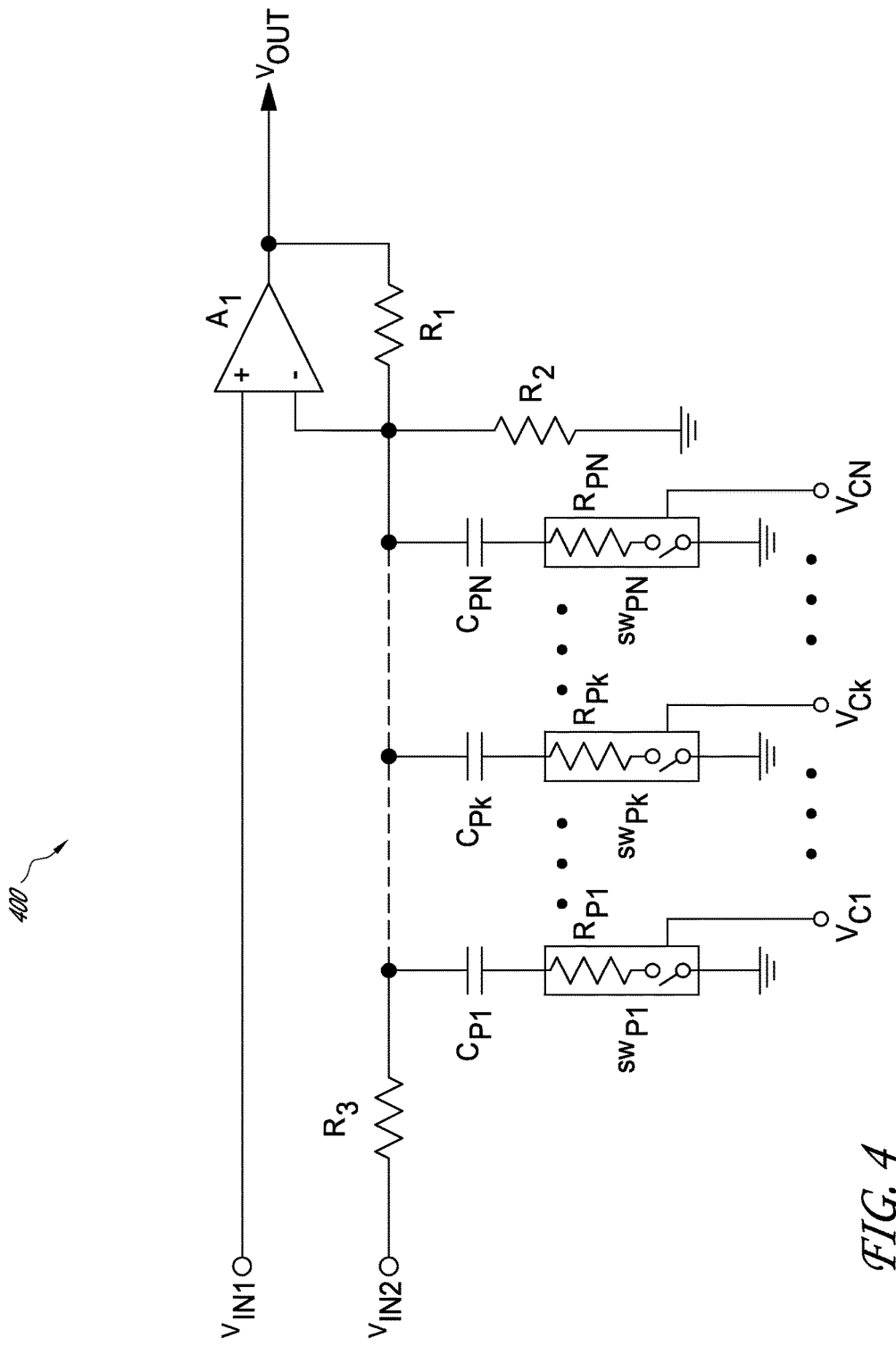
FIG. 4 is a diagram of an example single-ended two-input amplifying circuit according to another embodiment.

FIG. 4 is a diagram illustrating an example single-ended two-input amplifier in accordance with another embodiment. The illustrated amplifying circuit 400 can have adjustable gain flatness for the first input $v_{in1}$, and injection of the second input $v_{in2}$ via a resistor $R_3$. The circuit 400 in FIG. 4 can be implemented based on the circuit 100 of FIG. 1 by replacing the $C_P$-$R_P$ combination with several different capacitors $C_{Pk}$ selectable using switches $sw_{Pk}$ controlled by control voltages $V_{Ck}$, where $k=1, \ldots, N$, which can correspond to digital logic signals. Each switch $sw_{Pk}$ can also have an internal resistance $R_{Pk}$ (intrinsic or intentional), which can serve as the resistance $R_P$ in FIG. 1 when that switch is ON. The voltage-controlled switches $sw_{Pk}$ are general in nature and are included in the circuit for the purpose of illustrating the concept. In some embodiments, these switches can be implemented with, for example, relays, metal oxide semiconductor (MOS) transistors, MOS transmission gates, bipolar transistors, etc. While the terms "metal" and "oxide" may be present in, for example, a MOSFET, MOS transistors can have gates made out of materials other than metals, such as polysilicon, and have dielectric oxide regions made from dielectrics other than silicon oxide, such as a high-k dielectric. In some embodiments, the elements described herein, including the switches $sw_{Pk}$ (FIGS. 4, 5), $sw_{PAk}$ (FIGS. 10-17), and $sw_{PBk}$ (FIGS. 10-17), $k=1, \ldots, N$, may be implemented with other devices on silicon, compound, or any other suitable semiconductor.

By having different values for capacitors $C_{Pk}$ in FIG. 4, different degrees of peaking can be obtained by selectively turning on one or more of the different switches $sw_{Pk}$, resulting in a family of curves similar to the one shown in FIG. 3 for the transfer function $H_1(s)$ associated with the first input $v_{in1}$. From Equation (5), the transfer function $H_1(s)$ associated with the first input $v_{in1}$ in the circuit 400 can be determined by using the equivalent values $C_{PON}$ and $R_{PON}$ (associated with the branches that are ON), in lieu of $C_P$ and $R_P$, respectively. For relatively large open-loop gain of the amplifier $A_1$, the transfer function $H_2(s)$ associated with the second input $v_{in2}$ in FIG. 4 can be approximated by Equation (7), and can be practically independent of the switch selection that affects $H_1(s)$. As in the case of the circuits 100 and 200 of FIGS. 1 and 2, in some embodiments, the amplifier $A_1$ can be a voltage-mode amplifier or a current-feedback (transimpedance) amplifier. More than one of the switches $sw_{Pk}$, $k=1, \ldots, N$, can be selected to be ON at the same time, for example, for the purpose of limiting chip area in integrated circuits or generally for using capacitors in several branches to achieve larger total values. In certain embodiments, the amounts of capacitance of the capacitors $C_{Pk}$ can be binary weighted.

Figure 5:
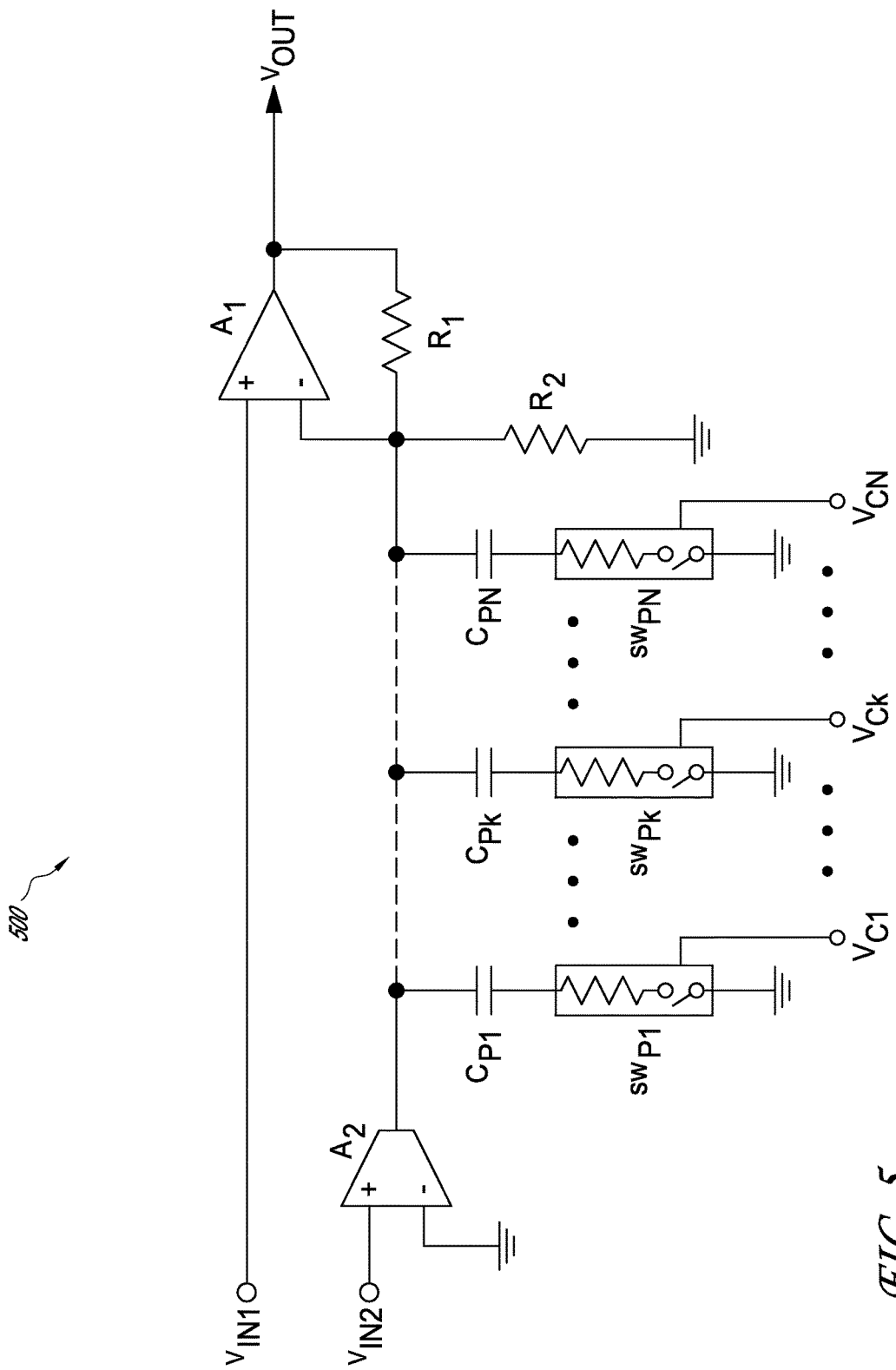
FIG. 5 is a diagram of an example single-ended two-input amplifying circuit according to another embodiment.

FIG. 5 is a diagram illustrating an example single-ended two-input amplifier in accordance with another embodiment. The illustrated amplifying circuit 500 can have adjustable gain flatness for the first input $v_{in1}$ and injection of the second input $v_{in2}$ via the transconductance amplifier $A_2$. The circuit 500 of FIG. 5 can be implemented based on the circuit 400 of FIG. 4 by replacing the resistor $R_3$ (FIG. 4) with the transconductance amplifier $A_2$, in a similar way in which the transconductance amplifier $A_2$ in FIG. 2 may replace the resistor $R_3$ in FIG. 1. The transfer function $H_1(s)$ of the circuit 500 is similar to the transfer function $H_1(s)$ of the circuit 400 discussed in connection with FIG. 4 above. For relatively large gain of the amplifier $A_1$, the transfer function $H_2(s)$ associated with the second input $v_{in2}$ in FIG. 5 can be approximated by Equation (9), and can be practically independent of the switch selection that affects $H_1(s)$.

Figure 6:
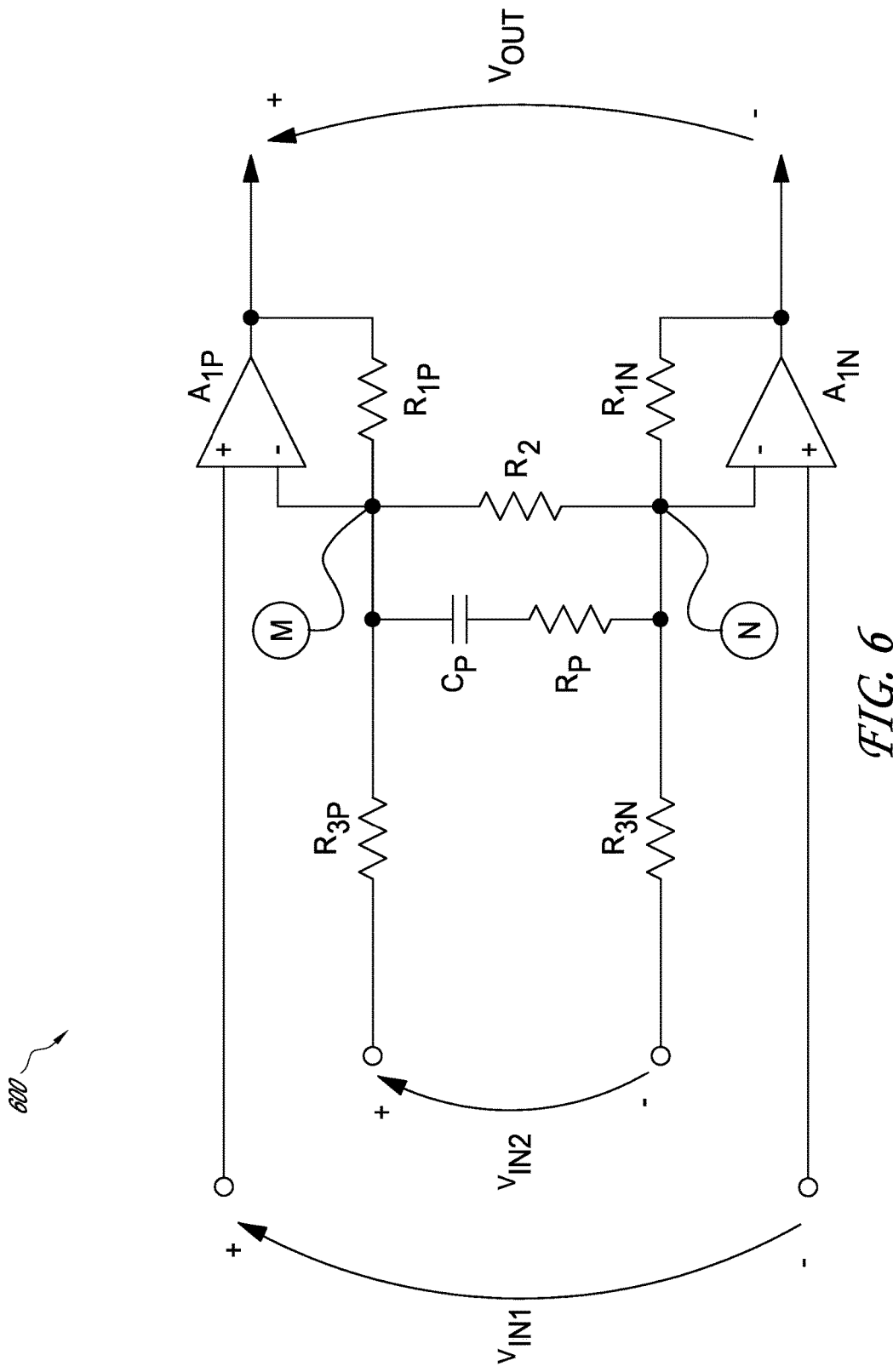
FIG. 6 is a diagram of an example differential two-input amplifying circuit according to one embodiment.

FIG. 6 is a diagram of an example differential two-input amplifier according to one embodiment. The illustrated amplifying circuit 600 uses two separate amplifier cores $A_{1P}$ and $A_{1N}$ and can have fixed high-frequency peaking for the first input pair $v_{in1+/-}$ and injection of the second input pair $v_{in2+/-}$ via resistors $R_{3P}$ and $R_{3N}$. The circuit 600 of FIG. 6 is a differential version of the circuit 100 of FIG. 1, and the circuit 600 has two differential input pairs $v_{in1+/-}$ and $v_{in2+/-}$, and fixed peaking associated with the first differential input pair $v_{in1+/-}$. In some embodiments of the circuit 600, the amplifiers $A_{1P}$ and $A_{1N}$ can be identical instances of each other and have similar corresponding functionalities as the amplifier $A_1$ of the circuit 100 (FIG. 1). Also in some embodiments, passive elements $R_{1P}$, $R_{1N}$, $R_{3P}$, and $R_{3N}$ can have the following relationships:

$$R_{1P} = R_{1N} = \frac{R_1}{2}, R_{3P} = R_{3N} = \frac{R_3}{2},$$

where $R_1$ and $R_3$ refer to the resistors $R_1$ and $R_3$ in FIG. 1. However, other ratios of resistance will be readily determined by one of ordinary skill in the art. In such embodiments, $H_1(s)$ (for the first input pair $v_{in1+/-}$) and $H_2(s)$ (for the second input pair $v_{in2+/-}$) can be determined based on Equations (5) and (7) respectively as discussed above, where $R_1=2R_{1P}=2R_{1N}$ and $R_3=2R_{3P}=2R_{3N}$. FIG. 6 also shows nodes M, N, which are inverting input nodes or feedback nodes of the amplifiers $A_{1P}$, $A_{1N}$ respectively. Characteristics of the nodes M, N of the circuit 600 are similar to the characteristics of the node M of the amplifier $A_1$ as discussed above in connection with FIG. 1.

Figure 7:
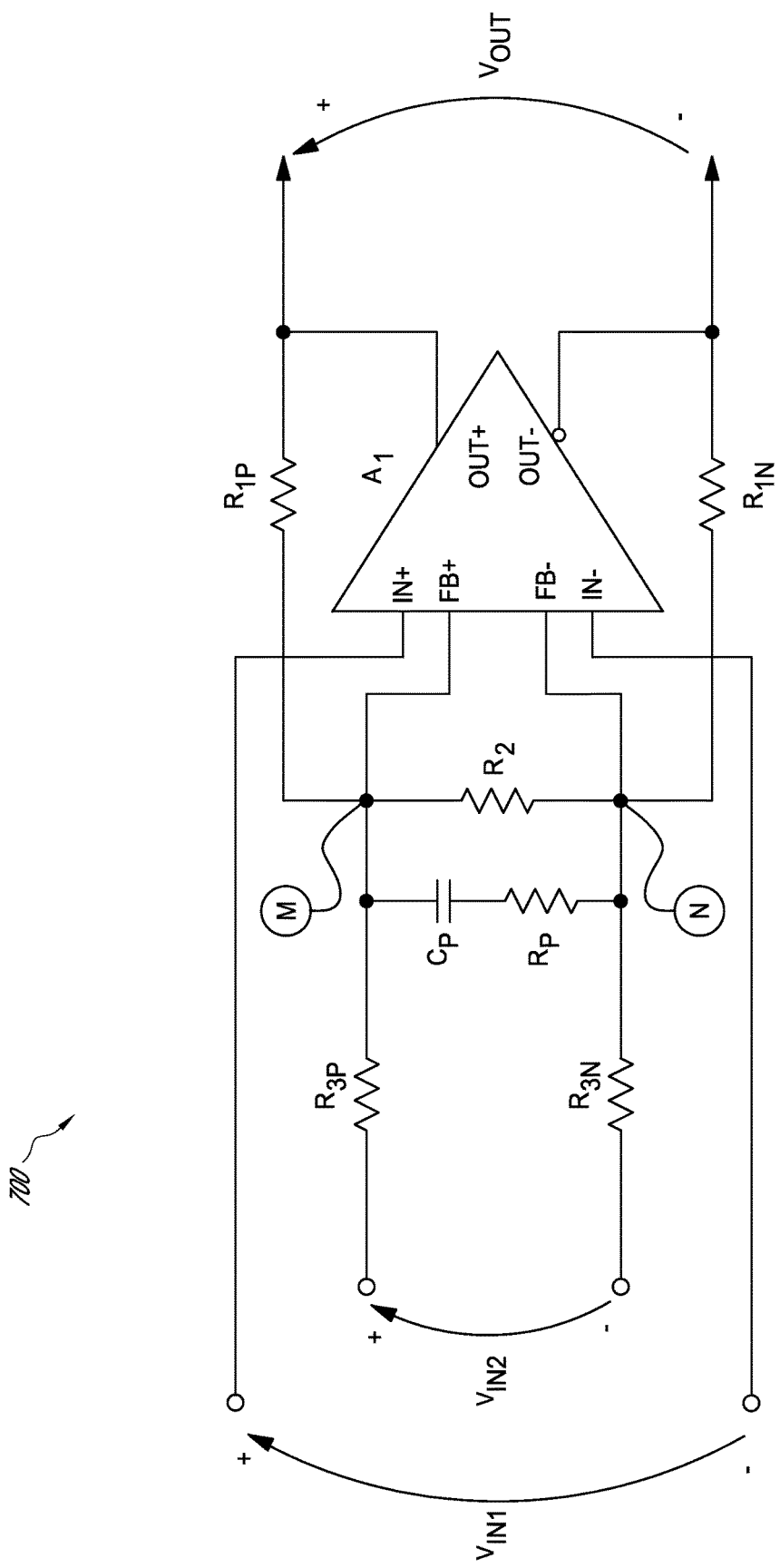
FIG. 7 is a diagram of an example differential two-input amplifying circuit according to another embodiment.

FIG. 7 is a diagram of an example differential two-input amplifier according to another embodiment. The illustrated amplifying circuit 700 uses a fully differential current-feedback amplifier core to implement the amplifier $A_1$ and can have fixed high-frequency peaking for the first input pair $v_{in1+/-}$ and injection of the second input pair $V_{in2+/-}$ via resistors $R_{3P}$ and $R_{3N}$. The circuit 700 uses the fully differential current-feedback (transimpedance) amplifier $A_1$ in lieu of the individual amplifiers $A_{1P}$ and $A_{1N}$ in FIG. 6. Similar operational amplifier analysis techniques can be applied for relatively large open-loop amplifier gain in FIGS. 6 and 7 as discussed above in connection with FIG. 1, by noticing that the voltages on nodes M and N follow the voltage nodes of the first input pair $v_{in1+/-}$ respectively.

Figure 8:
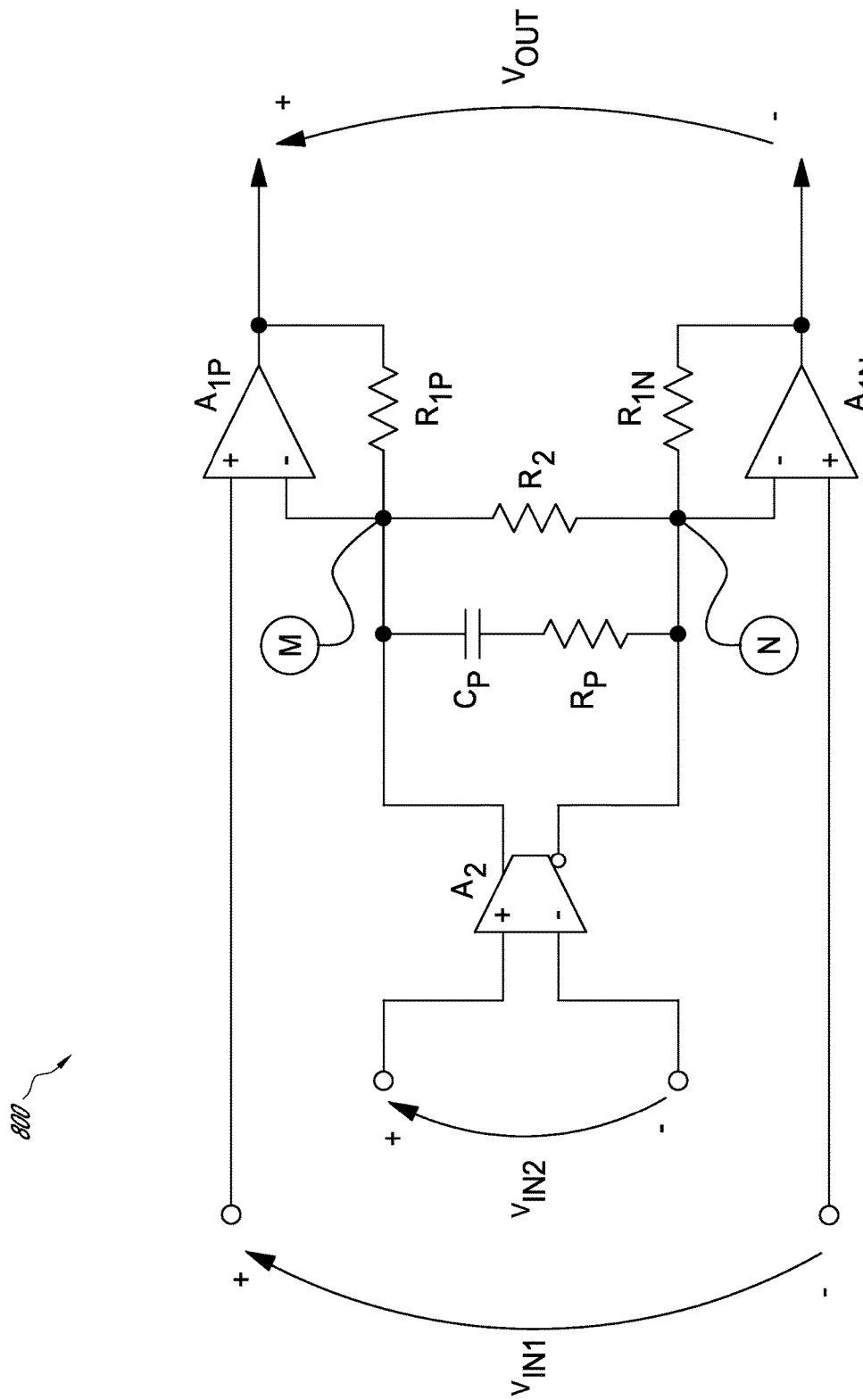
FIG. 8 is a diagram of an example differential two-input amplifying circuit according to another embodiment.

FIG. 8 is a diagram of an example differential two-input amplifier according to another embodiment. The illustrated amplifying circuit 800 uses two separate amplifier cores $A_{1P}$ and $A_{1N}$, and the circuit 800 can have fixed high-frequency peaking for the first input pair $v_{in1+/-}$ and injection of the second input pair $v_{in2+/-}$ via a differential transconductance amplifier $A_2$, which can be a differential version of the transconductance amplifier $A_2$ of FIGS. 2, 5 discussed above. The circuit 800 can be implemented based on the circuit 600 of FIG. 6 by replacing resistors $R_{3P}$ and $R_{3N}$ with the differential transconductance amplifier $A_2$. The transfer functions $H_1(s)$ and $H_2(s)$ associated with the two inputs are given by Equations (5) and (9), respectively, where $R_1=2R_{1P}=2R_{1N}$ and $G_A$ is the transconductance of $A_2$.

Figure 9:
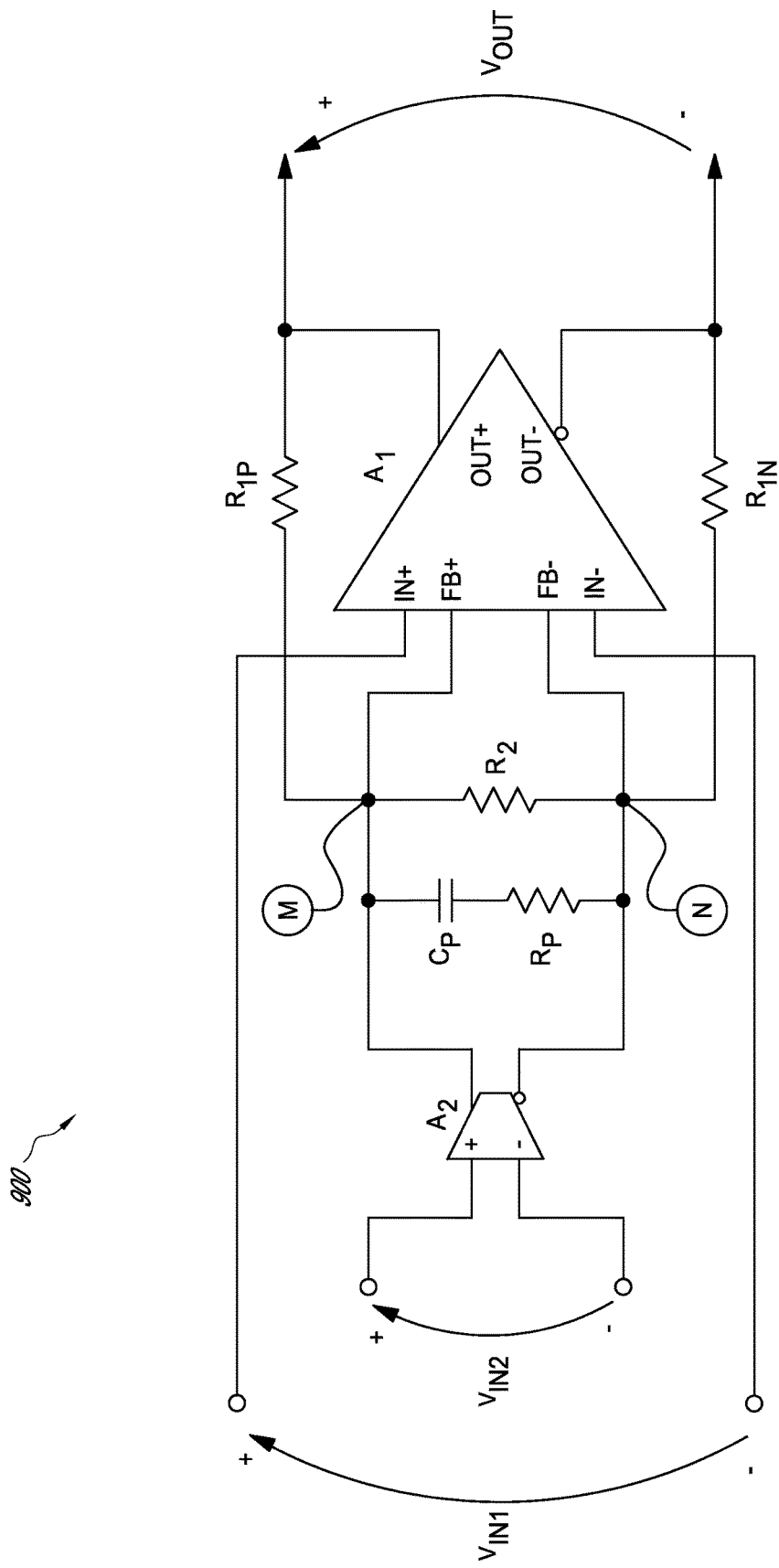
FIG. 9 is a diagram of an example differential two-input amplifying circuit according to another embodiment.

FIG. 9 is a diagram of an example differential two-input amplifier according to another embodiment. The illustrated amplifying circuit 900 uses a fully differential current-feedback amplifier core to implement the amplifier $A_1$ and can have fixed high-frequency peaking for the first input pair $v_{in1+/-}$ and injection of the second input pair $V_{in2+/-}$ via the differential transconductance amplifier $A_2$. The circuit 900 is an embodiment that uses a fully differential current-feedback (transimpedance) amplifier $A_1$ in lieu of the individual amplifiers $A_{1P}$ and $A_{1N}$ in the circuit 800 of FIG. 8. In other embodiments, the circuits 600, 700, 800, and 900 of FIGS. 6-9 can be implemented with a reference to a common-mode voltage $V_{CM}$ similar to the circuits 1000 (FIG. 10), 1200 (FIG. 12), 1400 (FIG. 14), and 1600 (FIG. 16) as discussed below, where the common mode voltage $V_{CM}$ can be generated in a separate circuit that produces a DC voltage relative to the ground or supply nodes such as a resistor divider or a DC current injected into a combination of transistors or resistors, possibly using an additional voltage buffer or a large capacitor at its output.

Figure 10:
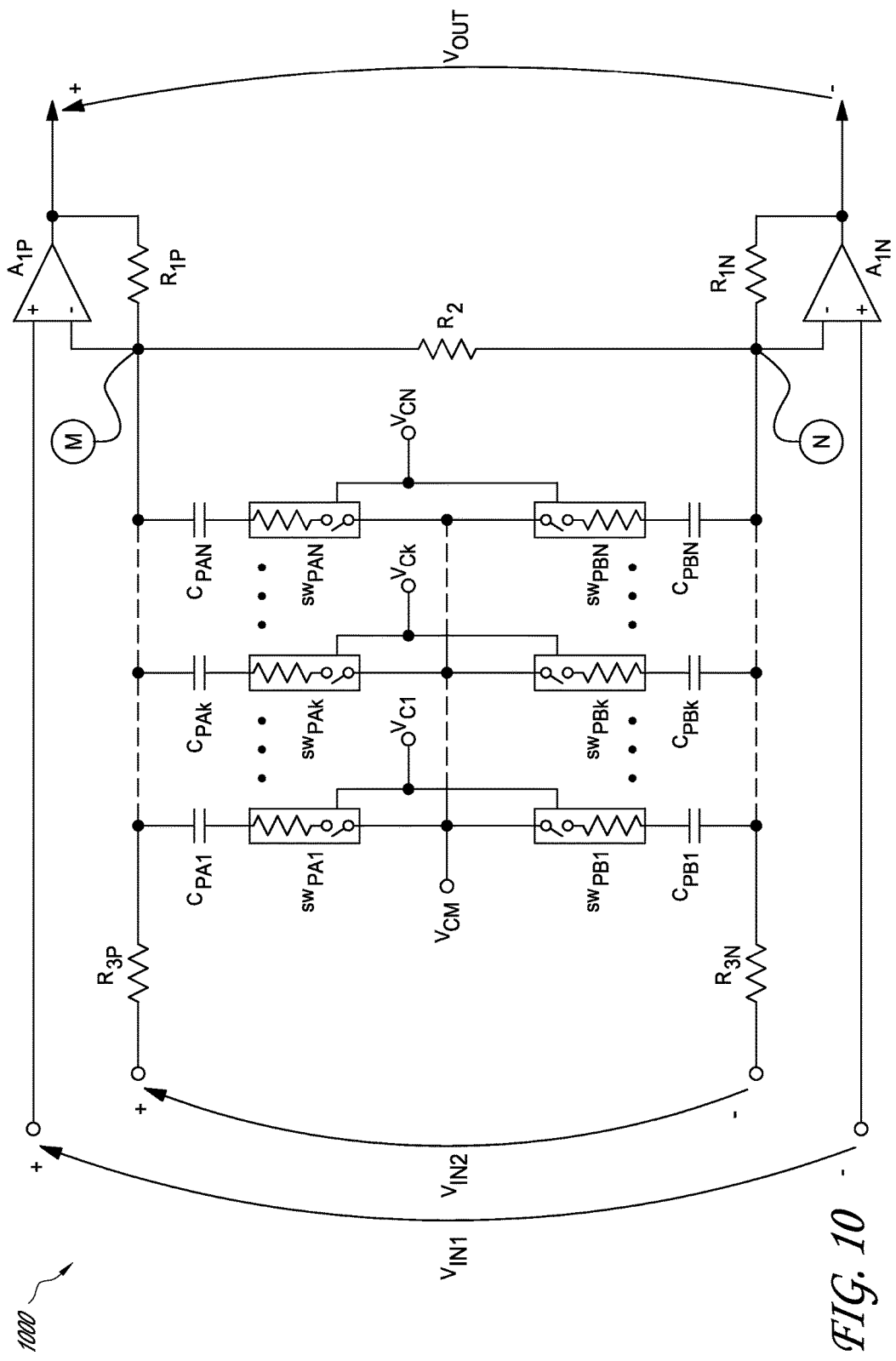
FIG. 10 is a diagram of an example differential two-input amplifying circuit according to another embodiment.

FIG. 10 is a diagram of an example differential two-input amplifier according to another embodiment. The illustrated amplifying circuit 1000 uses two separate amplifier cores $A_{1P}$ and $A_{1N}$ and switches $sw_{PAk}$, $sw_{PBk}$, referenced to a common-mode voltage $V_{CM}$, and the circuit 1000 can have adjustable gain flatness for the first input pair $v_{in1+/-}$ and injection of the second input pair $v_{in2+/-}$ via the resistors $R_{3P}$ and $R_{3N}$. The circuit 1000 is a differential version of the circuit 400 of FIG. 4, having two differential input pairs $v_{in1+/-}$, $V_{in2+/-}$ and adjustable peaking associated with the first input pair $v_{in1+/-}$. In some embodiments, $A_{1P}$ and $A_{1N}$ can be substantially same, capacitors $C_{PAk}$ and $C_{PBk}$, k=1, N, can be substantially same, and the resistors $R_{1N}$, $R_{1P}$, $R_{3N}$, and $R_{3P}$ can have the following relationships:

$$R_{1P} = R_{1N} = \frac{R_1}{2}, R_{3P} = R_{3N} = \frac{R_3}{2},$$

where $R_1$ and $R_3$ refer to the resistors $R_1$, $R_3$ of FIG. 4. Also in some embodiments, the switches $sw_{PAk}$, $sw_{PBk}$, k=1, . . . , N, can be substantially the same or identical instances to each other and connected as shown to the common-mode voltage $V_{CM}$, which can be the common-mode voltage of the two input pairs $v_{in1+/-}$, $v_{in2+/-}$. By having different values for capacitors $C_{PAk}$, $C_{PBk}$ in the circuit 1000, different degrees of peaking can be obtained by selectively turning on different switch pairs $sw_{PAk}$-$sw_{PBk}$, resulting in a family of curves similar to the one shown in FIG. 3 for the transfer function $H_1(s)$ associated with the first input pair $v_{in1+/-}$, which can be obtained based on Equation (5) by using the equivalent values $C_{PON}$ and $R_{PON}$ (associated with the branches that are ON), in lieu of $C_P$ and $R_P$, respectively. By way of example, if only branch k is ON, then $$C_{PON} = \frac{C_{PAk}}{2} = \frac{C_{PBk}}{2}$$

and $R_{PON}$ is the sum of the internal resistances of $sw_{PAk}$ and $sw_{PBk}$. Corresponding capacitance $C_{PON}$ and resistance $R_{PON}$ can be readily calculated if more than one branch is ON. For relatively large open-loop gains of the amplifiers $A_{1P}$, $A_{1N}$, the transfer function $H_2(s)$ associated with the second input pair $v_{in2+/-}$ in the circuit 1000 can be approximated by Equation (7) (where $R_1 = 2R_1 = 2R_{1N}$ and $R_3 = 2R_{3P} = 2R_{3N}$), and can be practically independent of the switch selection that affects $H_1(s)$.

Figure 11:
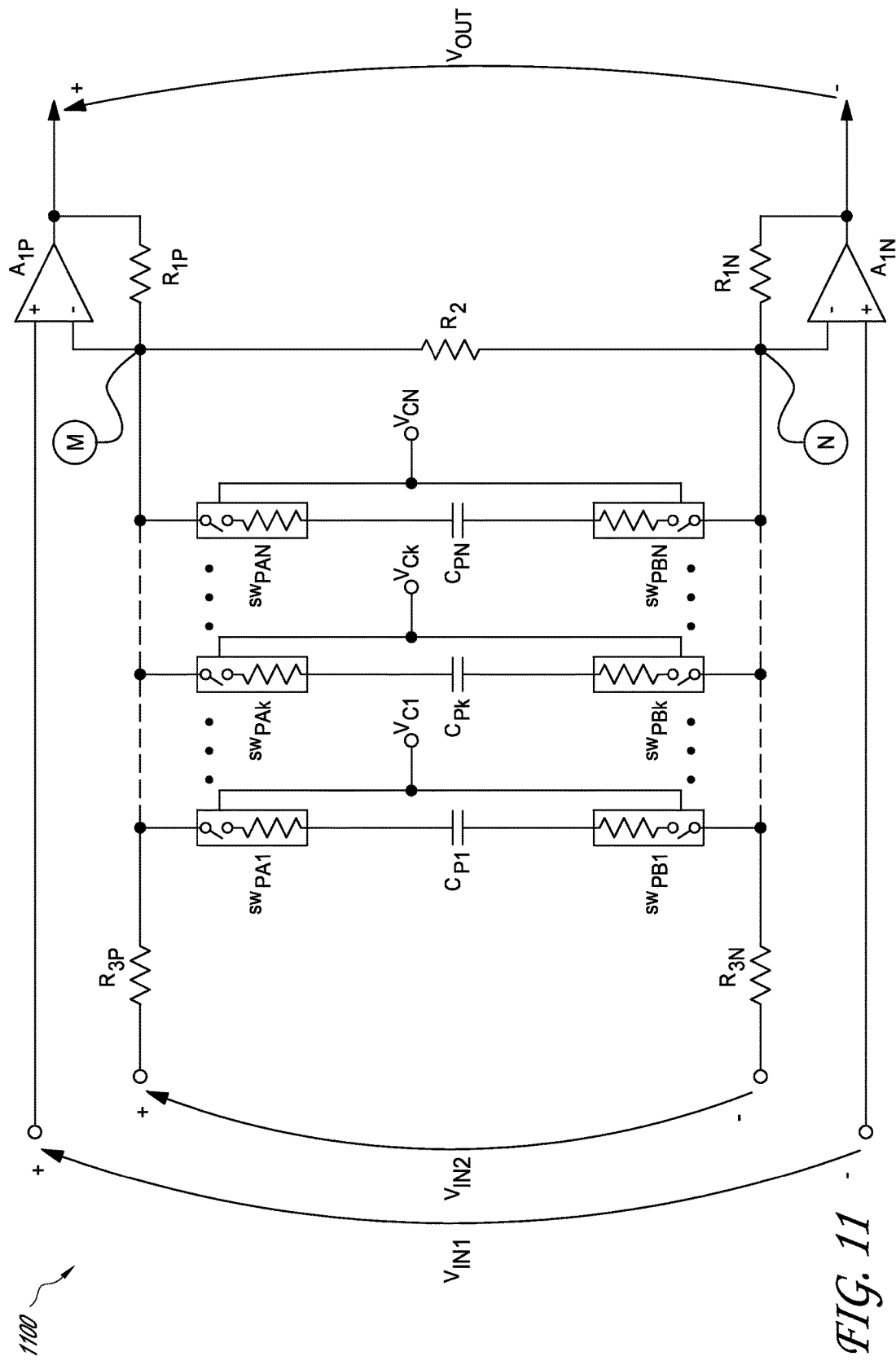
FIG. 11 is a diagram of an example differential two-input amplifying circuit according to another embodiment.

FIG. 11 is a diagram of an example differential two-input amplifier according to another embodiment. The illustrated amplifying circuit 1100 uses two separate amplifier cores $A_{1P}$ and $A_{1N}$ and has switches $sw_{PAk}$, $sw_{PBk}$ referenced to the inverting or feedback inputs of the amplifier cores $A_{1P}$ and $A_{1N}$. The circuit 1100 can have adjustable gain flatness for the first input pair $v_{in1+/-}$ and injection of the second input pair $v_{in2+/-}$ via the resistors $R_{3P}$ and $R_{3N}$. The circuit 1100 differs from the circuit 1000 of FIG. 10 in the connection arrangement of the switches $sw_{PAk}$ and $sw_{PBk}$, which are referenced to the inverting or feedback inputs of the amplifiers $A_{1P}$ and $A_{1N}$.

Figure 12:
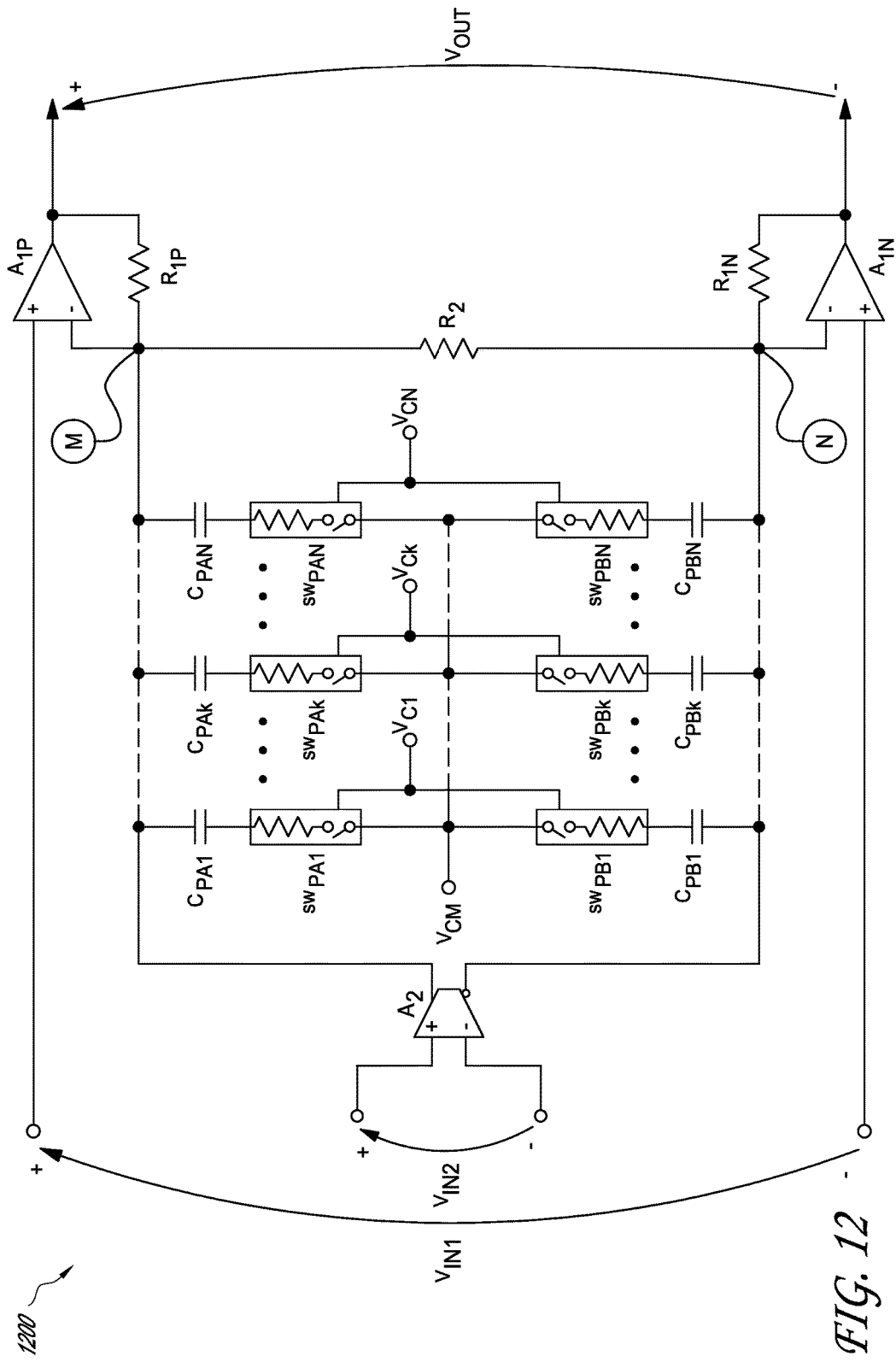
FIG. 12 is a diagram of an example differential two-input amplifying circuit according to another embodiment.

FIG. 12 is a diagram of an example differential two-input amplifier according to another embodiment. The illustrated amplifying circuit 1200 uses two separate amplifier cores $A_{1P}$ and $A_{1N}$ and has switches $sw_{PAk}$, $sw_{PBk}$ referenced to the common-mode voltage $V_{CM}$. The circuit 1200 can have adjustable gain flatness for the first input pair $v_{in1+/-}$ and injection of the second input pair $v_{in2+/-}$ via the differential transconductance amplifier $A_2$. The circuit 1200 can be modified from the circuit 1000 of FIG. 10 by replacing the resistors $R_{3P}$ and $R_{3N}$ with the differential transconductance amplifier $A_2$.

Figure 13:
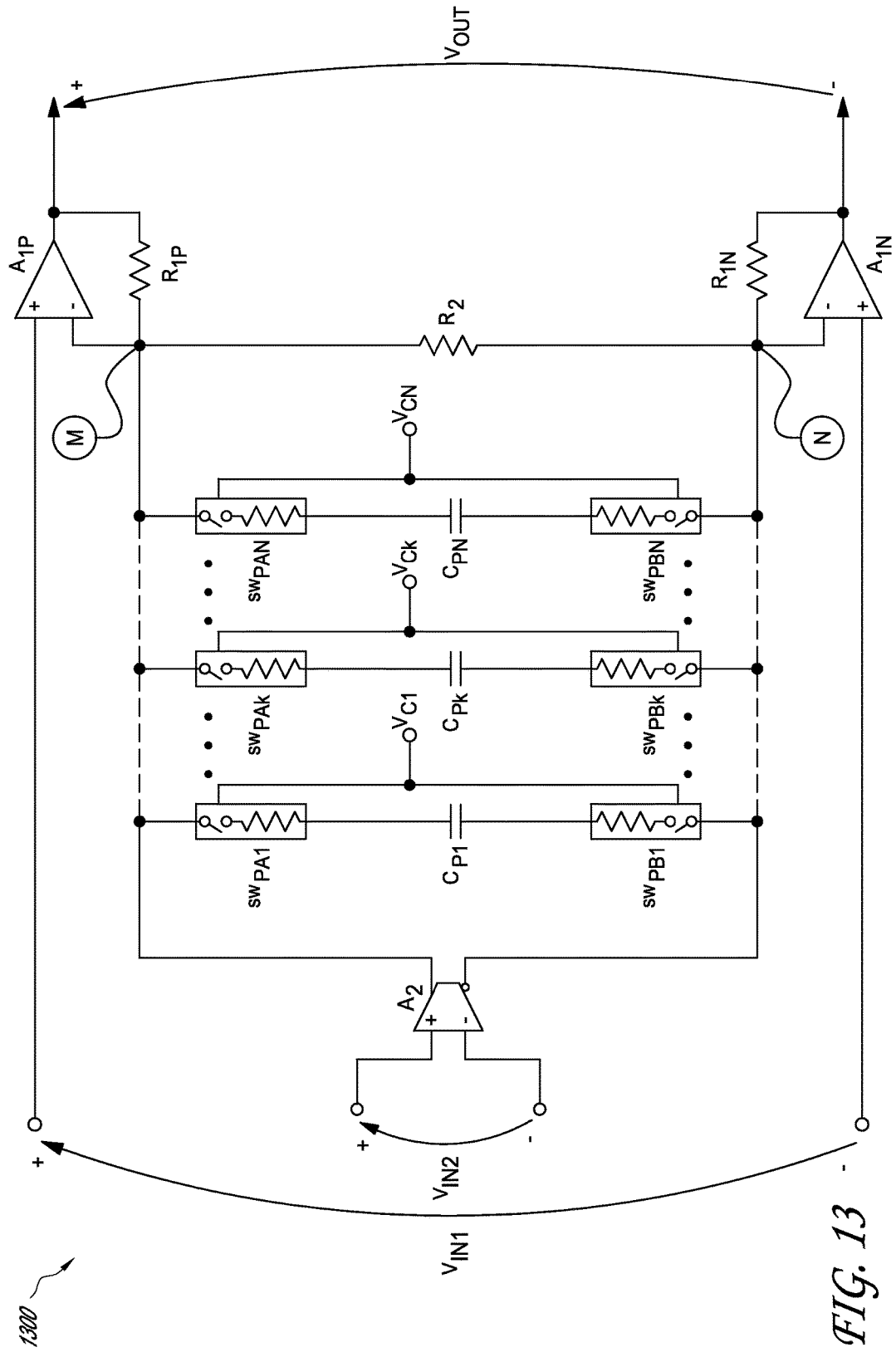
FIG. 13 is a diagram of an example differential two-input amplifying circuit according to another embodiment.

FIG. 13 is a diagram of an example differential two-input amplifier according to another embodiment. The illustrated amplifying circuit 1300 uses two separate amplifier cores $A_{1P}$ and $A_{1N}$ has switches $sw_{PAk}$, $sw_{PBk}$ referenced to the inverting or feedback inputs of the amplifier cores $A_{1P}$ and $A_{1N}$. The circuit 1300 has adjustable gain flatness for the first input pair $v_{in1+/-}$ and injection of the second input pair $v_{in2+/-}$ via the differential transconductance amplifier $A_2$. The circuit 1300 can be modified from the circuit 1100 of FIG. 11 by replacing the resistors $R_{3P}$ and $R_{3N}$ with the differential transconductance amplifier $A_2$.

Figure 14:
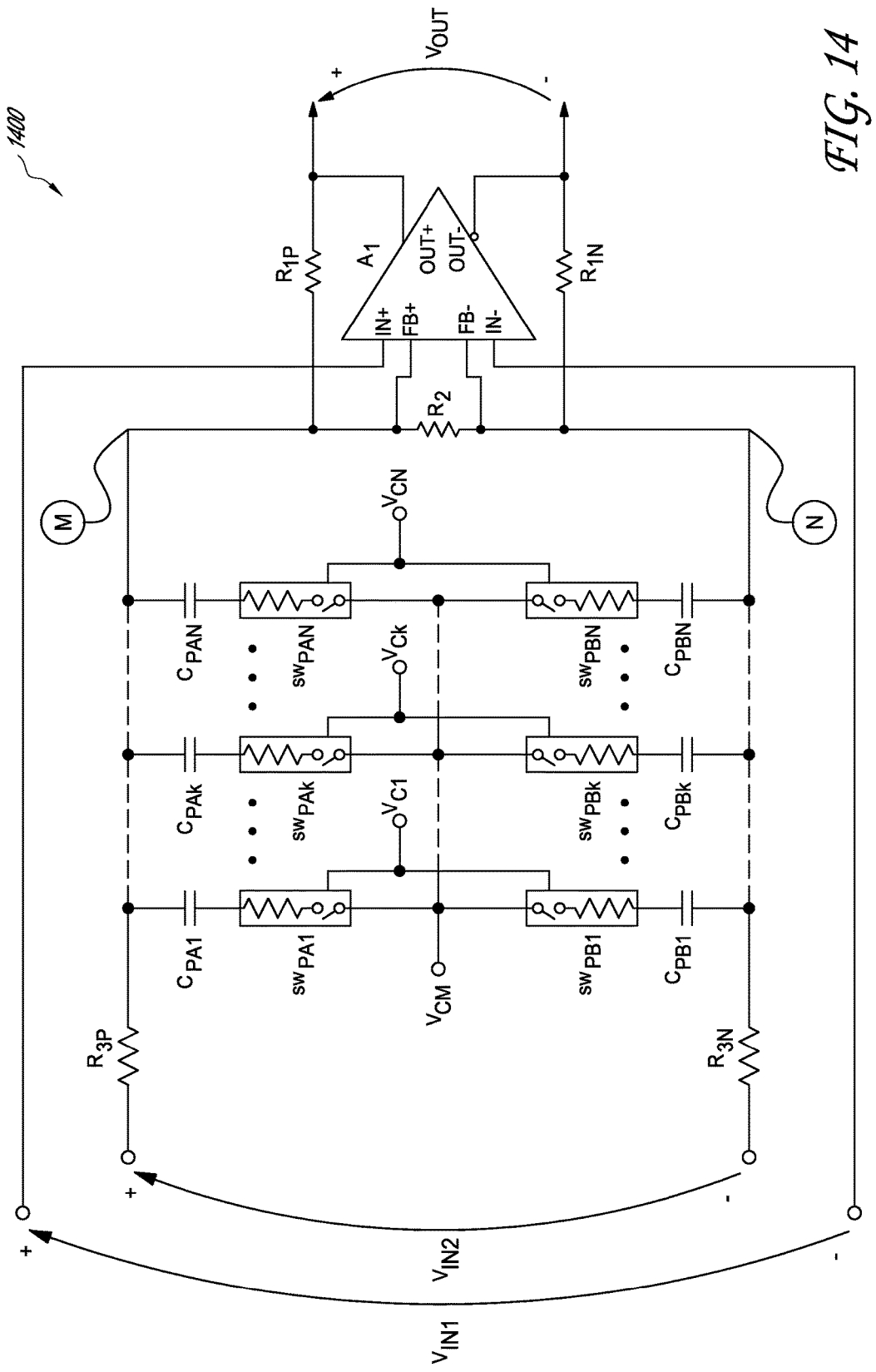
FIG. 14 is a diagram of an example differential two-input amplifying circuit according to another embodiment.

FIG. 14 is a diagram of an example differential two-input amplifier according to another embodiment. The illustrated amplifying circuit 1400 uses a fully differential current-feedback amplifier core to implement the amplifier $A_1$ and has switches $sw_{PAk}$, $sw_{PBk}$ referenced to the common-mode voltage $V_{CM}$. The circuit 1400 can have adjustable gain flatness for the first input pair $v_{in1+/-}$ and injection of the second input pair $v_{in2+/-}$ via the resistors $R_{3P}$ and $R_{3N}$. The circuit 1400 can be modified from the circuit 1000 of FIG. 10 by using the fully differential current-feedback (transimpedance) amplifier $A_1$ in lieu of the individual amplifiers $A_{1P}$ and $A_{1N}$.

Figure 15:
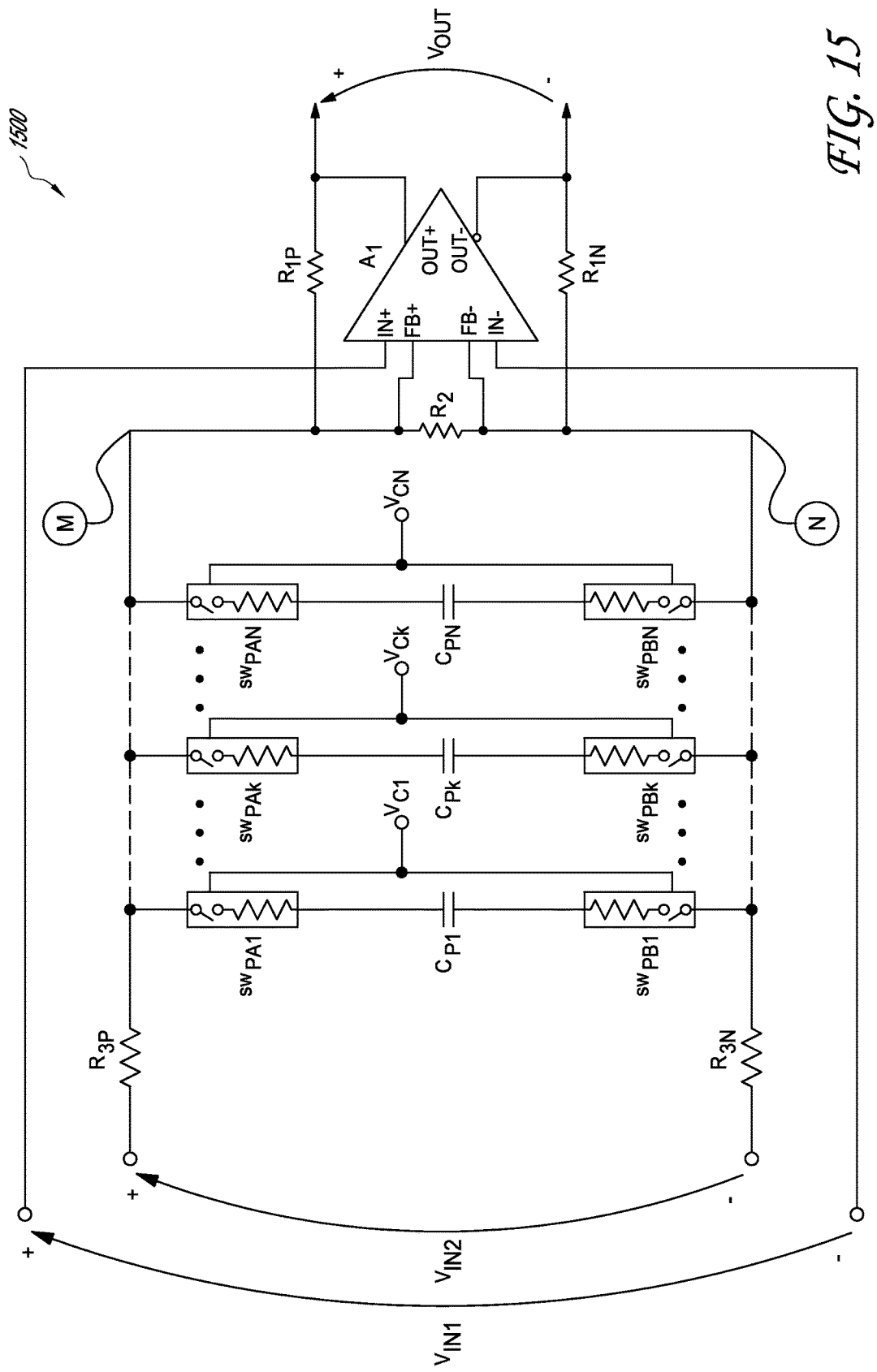
FIG. 15 is a diagram of an example differential two-input amplifying circuit according to another embodiment.

FIG. 15 is a diagram of an example differential two-input amplifier according to another embodiment. The illustrated amplifying circuit 1500 uses a fully differential current-feedback amplifier core to implement the amplifier $A_1$ and has switches $sw_{PAk}$, $sw_{PBk}$ referenced to the feedback inputs of the amplifier core $A_1$. The circuit 1500 can have adjustable gain flatness for the first input pair $v_{in1+/-}$ and injection of the second input pair $V_{in2+/-}$ via the resistors $R_{3P}$ and $R_{3N}$. The circuit 1500 can be modified from the circuit 1100 of FIG. 11 by using the fully differential current-feedback (transimpedance) amplifier $A_1$ in lieu of the individual amplifiers $A_{1P}$ and $A_{1N}$.

Figure 16:
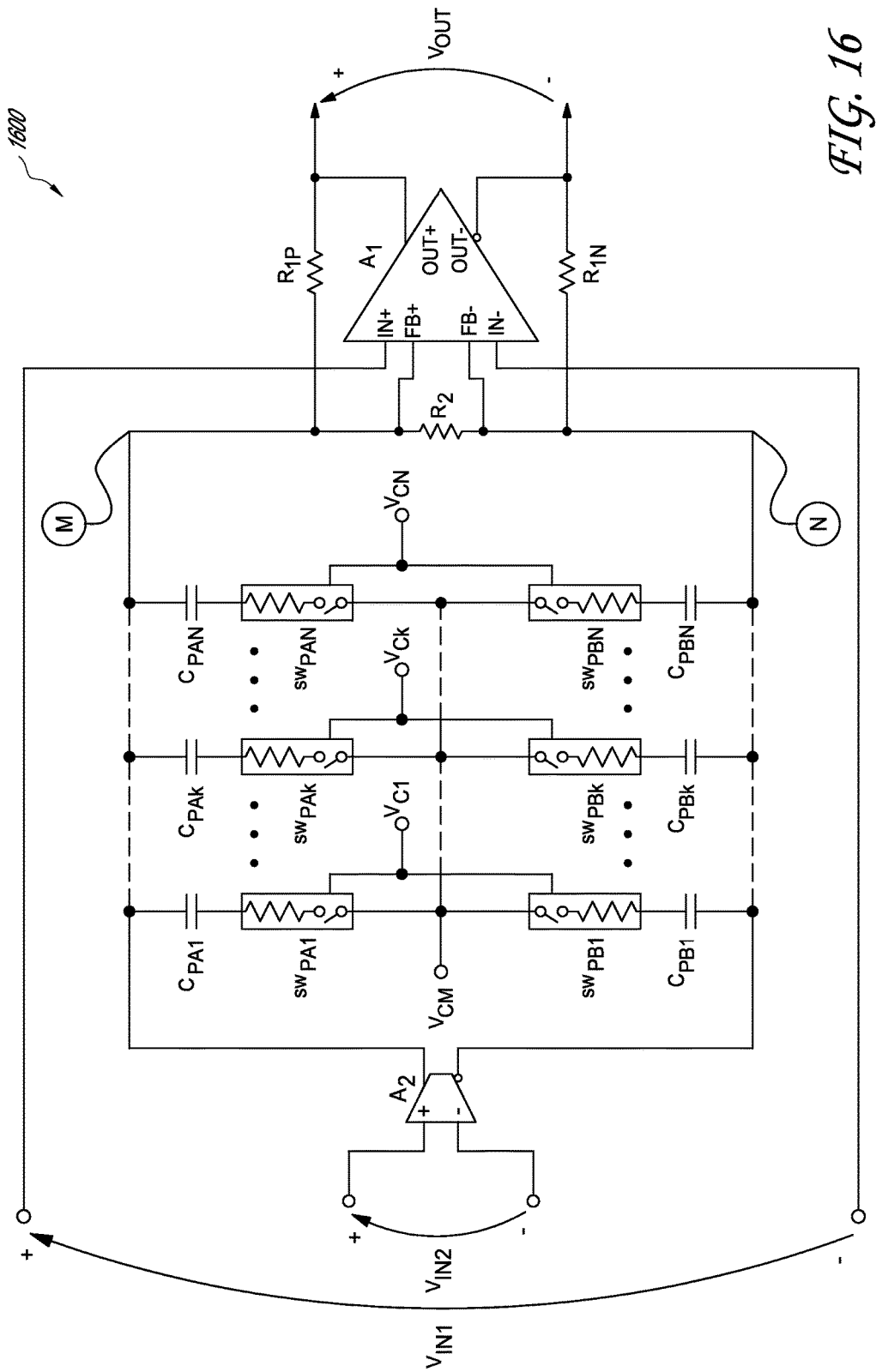
FIG. 16 is a diagram of an example differential two-input amplifying circuit according to another embodiment.

FIG. 16 is a diagram of an example differential two-input amplifier according to another embodiment. The illustrated amplifying circuit 1600 uses a fully differential current-feedback amplifier core to implement the amplifier $A_1$ and has switches $sw_{PAk}$, $sw_{PBk}$ referenced to the common-mode voltage $V_{CM}$. The circuit 1600 can have adjustable gain flatness for the first input pair $v_{in1+/-}$ and injection of the second input pair $v_{in2+/-}$ via the differential transconductance amplifier $A_2$. The circuit 1600 can be modified from the circuit 1200 of FIG. 12 by using the fully differential current-feedback (transimpedance) amplifier $A_1$ in lieu of the individual amplifiers $A_{1P}$ and $A_{1N}$.

Figure 17:
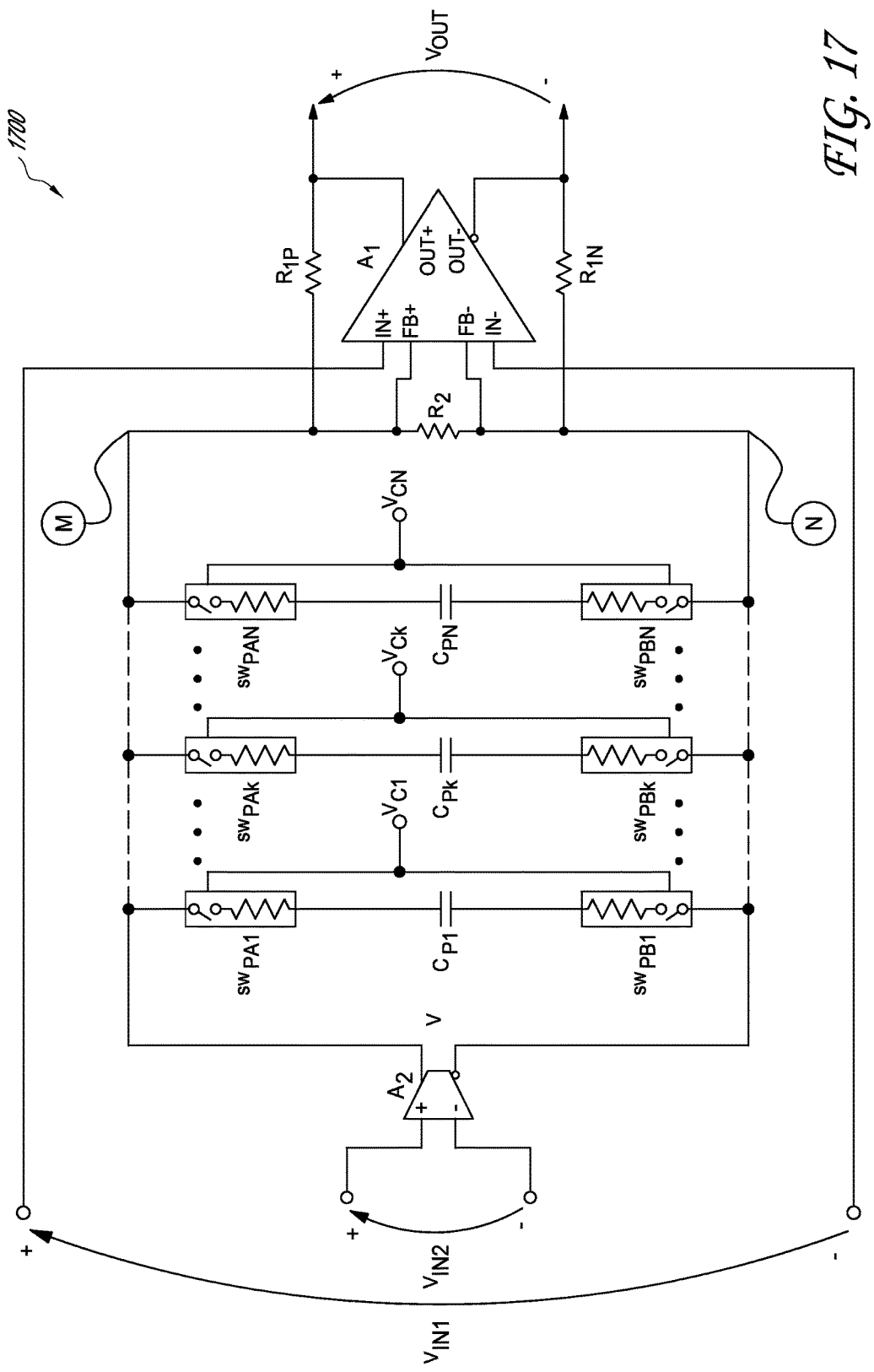
FIG. 17 is a diagram of an example differential two-input amplifying circuit according to another embodiment.

FIG. 17 is a diagram of an example differential two-input amplifier according to another embodiment. The illustrated amplifying circuit 1700 uses a fully differential current-feedback amplifier core to implement the amplifier $A_1$ and has switches $sw_{PAk}$, $sw_{PBk}$ referenced to the feedback inputs of the amplifier core $A_1$. The circuit 1700 can have adjustable gain flatness for the first input pair $v_{in1+/-}$ and injection of the second input pair $V_{in2+/-}$ via the differential transconductance amplifier $A_2$. The circuit 1700 can be modified from the circuit 1300 of FIG. 13 by using the fully differential current-feedback (transimpedance) amplifier $A_1$ in lieu of the individual amplifiers $A_{1P}$ and $A_{in}$.

The systems, apparatus, and/or methods discussed herein can be implemented in various electronic devices. Examples of the electronic devices can include, but are not limited to, consumer electronic products, parts of the consumer electronic products, electronic test equipment, wireless communications infrastructure such as base stations, automotive electronics, industrial electronics, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a wrist watch, a clock, etc. Further, the electronic device can include unfinished products.

Unless the context clearly requires otherwise, throughout the description and the clauses, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings provided herein can be applied to other apparatus, not necessarily the apparatus described above. The elements and acts of the various embodiments described above can be combined to provide further embodiments.

While certain embodiments have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure.

What is claimed is:

1. An apparatus comprising:
   a first amplifier having at least one non-inverting input node, at least one inverting input node, and at least one output node, the at least one non-inverting input node being configured to receive a first input signal;
   at least one feedback resistor disposed in a signal path between the at least one inverting input node and the at least one output node;
   at least one input device disposed in a signal path between the at least one inverting input node and a second input signal; and
   a peaking network comprising at least one passive storage device and at least one resistive device connected in series and between the at least one inverting input node and a second node, wherein the second node comprises a ground or a second inverting input node, such that the peaking network is configured to shape a frequency response of amplification of the first input signal, but not the second input signal.

2. The apparatus of claim 1, wherein the at least one input device comprises one or more resistors.

3. The apparatus of claim 1, wherein the at least one input device comprises a transconductance amplifier.

4. The apparatus of claim 1, wherein the first input signal comprises a first differential input signal, and the second input signal comprises a second differential input signal.

5. The apparatus of claim 4, the apparatus further comprising:
   a second amplifier having a first non-inverting input node, an inverting input node, and an output node, wherein the first non-inverting input node of the first amplifier is configured to receive a first signal of the first differential input pair, and the first non-inverting input node of the second amplifier is configured to receive the other signal of the first differential input pair;
   a second feedback resistor connected between the inverting input node of the second amplifier and the output node of the second amplifier,
   wherein the peaking network is connected between the inverting input node of the first amplifier and the inverting input node of the second amplifier.

6. The apparatus of claim 1, wherein the peaking network is configured to shape a frequency response of amplification of the first input signal and amplify the second input signal substantially independently of each other.

7. The apparatus of claim 1, wherein the at least one passive storage device comprises two or more capacitors, the apparatus further comprising two or more switches each connected in series with the two or more capacitors, wherein the two or more switches are configured to adjust a frequency response of amplification of the first input signal based at least in part on states of one or more control signals.

8. The apparatus of claim 1, wherein the peaking network is further connected to a reference voltage.

9. The apparatus of claim 1, wherein a second input signal gain is based on the at least one feedback resistor and the input device.

10. The apparatus of claim 1, wherein the first amplifier comprises a current-feedback amplifier.

11. The apparatus of claim 1, wherein the first amplifier comprises a fully-differential amplifier.

12. The apparatus of claim 1, wherein the second node comprises a ground node.

13. The apparatus of claim 1, wherein the second node comprises the second inverting input node.

14. An apparatus for amplifying, the apparatus comprising:
   a first amplifier having at least one non-inverting input node, at least one inverting input node, and at least one output node, the at least one non-inverting input node being configured to receive a first input signal;
   at least one feedback resistor disposed in a signal path between the at least one inverting input node and the at least one output node;
   at least one input device disposed in a signal path between the at least one inverting input node and a second input signal; and
   a means for frequency shaping coupled between the at least one inverting input node and a second node, wherein the second node comprises a ground or a second inverting input node, wherein the frequency shaping means is configured to shape a frequency response of amplification of the first input signal, but not the second input signal.

15. A method of amplifying, the method comprising:
   receiving a first input signal at a first non-inverting input node of a first amplifier, wherein the first amplifier also has at least one inverting input node and at least one output node, wherein there is at least one feedback resistor disposed in a signal path between the at least one inverting input node and the at least one output node, wherein there is at least one input device disposed in a signal path between the at least one inverting input node and a second input signal; and
   frequency shaping a frequency response of amplification of the first input signal, but not the second input signal via a peaking network coupled between the at least one inverting input node and a second node, wherein the second node comprises a ground or a second inverting input node, wherein the peaking network comprises at least one passive storage device and at least one resistive device connected in series and between the at least one inverting input node and a second node.

16. The method of claim 15, wherein the at least one input device comprises a transconductance amplifier.

17. The method of claim 15, wherein the first input signal comprises a first differential input signal, and the second input signal comprises a second differential input signal.

18. The method of claim 17, the method further comprising:
   receiving a first signal of the first differential input pair at a first non-inverting input node of a second amplifier, the second amplifier also having, an inverting input node and an output node; and
   receiving the other signal of the first differential input pair at the first non-inverting input node of the second amplifier, wherein a second feedback resistor is connected between the inverting input node of the second amplifier and the output node of the second amplifier, wherein the peaking network is connected between the inverting input node of the first amplifier and the inverting input node of the second amplifier.

19. The method of claim 15, wherein the at least one passive storage device comprises two or more capacitors, the method further controlling two or more switches each connected in series with the two or more capacitors such that control of the switches adjusts a frequency response of amplification of the first input signal.

* * * * *